United States Patent [19]

Mattson et al.

[11] Patent Number: 5,542,066
[45] Date of Patent: Jul. 30, 1996

[54] DESTAGING MODIFIED DATA BLOCKS FROM CACHE MEMORY

[75] Inventors: Richard L. Mattson; Jaishankar M. Menon, both of San Jose, Calif.

[73] Assignee: International Business Machines Corporation, Armonk, N.Y.

[21] Appl. No.: 172,527

[22] Filed: Dec. 23, 1993

[51] Int. Cl.⁶ .................................................. G06F 12/00
[52] U.S. Cl. ............................ 395/463; 395/456; 395/440
[58] Field of Search .................................. 395/400, 425, 395/444, 445, 456, 460, 463

[56] References Cited

U.S. PATENT DOCUMENTS

| | | | |
|---|---|---|---|
| 4,394,732 | 7/1983 | Swenson | 364/200 |
| 4,463,424 | 7/1984 | Mattson et al. | 395/425 |
| 4,506,323 | 3/1985 | Pusic et al. | 364/200 |
| 4,598,357 | 7/1986 | Swenson et al. | 364/200 |
| 4,831,622 | 5/1989 | Porter et al. | 371/10 |
| 4,875,155 | 10/1989 | Iskiyan et al. | 364/200 |
| 4,916,605 | 4/1990 | Beardsley et al. | 364/200 |
| 4,920,536 | 4/1990 | Hammond et al. | 371/10.1 |
| 5,051,887 | 9/1991 | Berger et al. | 364/200 |
| 5,124,987 | 6/1992 | Milligan et al. | 371/10.1 |
| 5,146,588 | 9/1992 | Crater et al. | 395/575 |
| 5,155,835 | 10/1992 | Belsan | 395/425 |
| 5,193,184 | 3/1993 | Belsan et al. | 395/600 |
| 5,210,866 | 5/1993 | Milligan et al. | 395/575 |
| 5,239,659 | 8/1993 | Rudeseal et al. | 395/800 |
| 5,357,623 | 10/1994 | Megory-Cohen | 395/425 |
| 5,394,531 | 2/1995 | Smith | 395/425 |
| 5,418,921 | 5/1995 | Cortney et al. | 395/425 |

OTHER PUBLICATIONS

Thiébaut, D. et al, "Improving Disk Cache Hit–Ratios Through Cache Partitioning", IEEE Trans. on Computers, V. 41 No. 6 pp. 665–676.

Sasinowski, J. et al, "A Dynamic Partitioning Algorithm . . . ", IEEE Trans. on Computers, V. 42, No. 8, pp. 997–1001.

Stone, H. et al, "Optimal Partitioning of Cache Memory", IEEE Trans. on Computers, V. 41, No. 9, pp. 1054–1068.

*Primary Examiner*—Rebecca L. Rudolph
*Attorney, Agent, or Firm*—Baker, Maxham, Jester & Meador

[57] ABSTRACT

A controller for a disk array with parity and sparing includes a non-volatile cache memory and optimizes the destaging process for blocks from the cache memory to both maximize the cache hit ratio and minimize disk utilization. The invention provides a method for organizing the disk array into segments and dividing the cache memory into groups in order of least recently used memory locations and then determining metrics that permit the disk array controller to identify the cache memory locations having the most dirty blocks by segment and group and to identify the utilization rates of the disks. These characteristics are considered to determine when, what, and how to destage. For example, in terms of maximizing the cache hit ratio, when the percentage of dirty blocks in a particular group of the cache memory locations reaches a predetermined level, destaging is begun. The destaging operation continues until the percentage of dirty blocks decreases to a predetermined level. In terms of minimizing disk utilization, all of the dirty blocks in a segment having the most dirty blocks in a group are destaged.

27 Claims, 21 Drawing Sheets

DISK LAYOUT

| Segment | Segment S0 | Segment S1 | Segment S2 | Segment S3 | Segment S4 | Segment S5 |
|---|---|---|---|---|---|---|
| Track | 000111222 | 000111222 | 000111222 | 000111222 | 000111222 | 000111222 |
| Block | 012012012 | 012012012 | 012012012 | 012012012 | 012012012 | 012012012 |
| Disk 1 | xxx11xxxx | 10x011xxx | xxxPPPSSS | x1xxxxxxx | 0xx0x1xxx | ***PPPSSS |
| Disk 2 | x0x0xxxxx | xxxxx0xxx | PPPSSS10x | xx1xx11xx | 1x01xxx1x | PPPSSS*** |
| Disk 3 | x1xxxx1xx | 0xxx01PPP | SSS1x0x1x | 1xx00xxx1 | xxx1xxPPP | SSS****** |
| Disk 4 | x10111xxx | 0x1PPPSSS | x1x0xxxxx | xxxx0110 | 0xxPPPSSS | ********** |
| Disk 5 | 01xxx1xxx | PPPSSSxx1 | 1111x1xxx | xxxx0x00x | PPPSSSx0x | ********** |
| Disk 6 | 000xxxPPP | SSSxxxx0x1 | 10x1xx0x0 | 1xxxx0PPP | SSS00xx1x | ********** |
| Disk 7 | 0x1PPPSSS | x1x1xx11x | xx0x0x01x | xx1PPPSSS | 10xx0xxxx | ********** |
| Disk 8 | PPPSSS1xx | 0xx000xxx | x0xxxxxx0 | PPPSSS11x | x11011100 | ********** |
| Disk 9 | SSSxx0x0x | xxx0x1x1x0 | xx1001PPP | SSSx000xx | 00x1001xx | ******PPP |
| No. DBkP | 031222200 | 111222212 | 222302120 | 212001321 | 211312220 | 000000000 |
| Block | 012012012 | 012012012 | 012012012 | 012012012 | 012012012 | 012012012 |
| Track | 000111222 | 000111222 | 000111222 | 000111222 | 000111222 | 000111222 |
| Segment | Segment S0 | Segment S1 | Segment S2 | Segment S3 | Segment S4 | Segment S5 |
| No. DBkS | 12 | 13 | 14 | 12 | 14 | -0- |
| % DBkS | 9.38% | 10.16% | 10.94% | 9.38% | 10.94% | 0% |

FIG. 2

CACHE DIRECTORY

| Loc | D | S | T | B | C | G | NA | PA | NS | PS |
|---|---|---|---|---|---|---|---|---|---|---|
| 0 | 5 | 2 | 0 | 0 | 1 | 4 | 10 | 55 | 16 | 41 |
| 1 | 9 | 3 | 2 | 0 | 0 | 4 | 48 | 114 | 28 | 10 |
| 2 | 6 | 0 | 0 | 1 | 0 | 2 | 69 | 110 | 91 | 127 |
| 3 | 9 | 1 | 2 | 0 | 1 | 3 | 68 | 83 | 68 | 6 |
| 4 | 9 | 2 | 1 | 2 | 1 | 4 | 72 | 29 | 15 | 24 |
| 5 | 3 | 1 | 0 | 0 | 0 | 4 | 86 | 51 | 59 | 51 |
| 6 | 9 | 1 | 0 | 2 | 0 | 3 | 13 | 107 | 3 | 107 |
| 7 | 2 | 4 | 1 | 0 | 1 | 4 | 50 | 102 | 17 | 63 |
| 8 | 8 | 2 | 2 | 2 | 0 | 1 | 74 | 99 | 74 | 95 |
| 9 | 5 | 3 | 1 | 1 | 0 | 4 | 55 | 41 | 10 | 84 |
| 10 | 5 | 3 | 2 | 1 | 0 | 4 | 111 | 0 | 1 | 9 |
| 11 | 6 | 1 | 2 | 0 | 0 | 2 | 110 | 127 | 69 | 12 |
| 12 | 7 | 1 | 2 | 1 | 1 | 2 | 42 | 54 | 11 | 104 |
| 13 | 8 | 4 | 0 | 1 | 1 | 3 | 123 | 6 | 123 | 113 |
| 14 | 8 | 1 | 1 | 1 | 0 | 4 | 79 | 36 | 102 | 112 |
| 15 | 6 | 2 | 0 | 0 | 1 | 4 | 85 | 72 | 82 | 4 |
| 16 | 7 | 2 | 0 | 2 | 0 | 4 | 24 | 28 | 24 | 0 |
| 17 | 1 | 4 | 0 | 0 | 0 | 5 | 95 | 67 | 40 | 7 |
| 18 | 4 | 0 | 1 | 2 | 1 | 3 | 103 | 73 | 88 | 96 |
| 19 | 2 | 4 | 0 | 0 | 1 | 4 | 97 | 38 | 97 | 57 |
| 20 | 5 | 2 | 0 | 1 | 1 | 4 | 30 | 106 | 30 | 36 |
| 21 | 9 | 3 | 1 | 2 | 0 | 4 | 92 | 39 | 92 | 39 |
| 22 | 6 | 0 | 0 | 2 | 0 | 4 | 63 | 58 | 75 | 106 |
| 23 | 6 | 4 | 1 | 1 | 0 | 4 | 90 | 97 | 85 | 97 |
| 24 | 4 | 2 | 0 | 1 | 1 | 4 | 25 | 16 | 4 | 16 |
| 25 | 8 | 1 | 1 | 0 | 0 | 4 | 35 | 24 | 89 | 101 |
| 26 | 9 | 0 | 1 | 2 | 0 | 4 | 93 | 50 | 33 | 75 |
| 27 | 6 | 3 | 0 | 0 | 1 | 5 | 67 | 33 | 67 | 78 |
| 28 | 2 | 3 | 1 | 2 | 1 | 4 | 16 | 57 | 35 | 1 |
| 29 | 7 | 0 | 0 | 0 | 0 | 4 | 4 | 44 | 72 | 90 |
| 30 | 5 | 2 | 0 | 2 | 1 | 4 | 100 | 20 | 77 | 20 |
| 31 | 4 | 2 | 1 | 0 | 0 | 2 | 34 | 91 | 34 | 74 |
| Loc | D | S | T | B | C | G | NA | PA | NS | PS |

FIG. 3

CACHE DIRECTORY (Continued)

| Loc | D | S | T | B | C | G | NA | PA | NS | PS |
|---|---|---|---|---|---|---|---|---|---|---|
| 32 | 8 | 4 | 2 | 2 | 0 | 3 | 84 | 45 | 83 | 45 |
| 33 | 5 | 0 | 0 | 0 | 0 | 5 | 27 | 86 | 42 | 26 |
| 34 | 6 | 2 | 0 | 1 | 0 | 2 | 43 | 31 | 87 | 31 |
| 35 | 3 | 3 | 0 | 0 | 1 | 4 | 89 | 25 | 39 | 28 |
| 36 | 9 | 2 | 1 | 0 | 0 | 4 | 14 | 82 | 20 | 82 |
| 37 | 9 | 2 | 0 | 2 | 1 | 4 | 78 | 93 | 94 | 93 |
| 38 | 9 | 0 | 2 | 1 | 0 | 4 | 19 | 89 | 90 | 48 |
| 39 | 4 | 3 | 2 | 1 | 1 | 4 | 21 | 52 | 21 | 35 |
| 40 | 8 | 4 | 1 | 0 | 0 | 1 | 119 | 74 | 76 | 17 |
| 41 | 7 | 2 | 1 | 1 | 0 | 4 | 9 | 46 | 0 | 62 |
| 42 | 2 | 0 | 0 | 1 | 0 | 2 | 47 | 12 | 47 | 33 |
| 43 | 7 | 4 | 0 | 1 | 0 | 2 | 87 | 34 | 113 | 124 |
| 44 | 3 | 1 | 1 | 2 | 1 | 4 | 29 | 92 | 70 | 52 |
| 45 | 6 | 4 | 1 | 0 | 0 | 3 | 32 | 120 | 32 | 61 |
| 46 | 2 | 0 | 1 | 0 | 0 | 4 | 41 | 122 | 48 | 108 |
| 47 | 8 | 0 | 2 | 0 | 1 | 2 | 126 | 42 | 127 | 42 |
| 48 | 4 | 0 | 1 | 0 | 1 | 4 | 65 | 1 | 38 | 46 |
| 49 | 9 | 4 | 1 | 1 | 0 | 3 | 61 | 118 | 61 | 116 |
| 50 | 3 | 2 | 1 | 2 | 0 | 4 | 26 | 7 | 93 | 109 |
| 51 | 7 | 1 | 1 | 0 | 1 | 4 | 5 | 94 | 5 | 102 |
| 52 | 4 | 1 | 0 | 2 | 1 | 4 | 39 | 90 | 44 | 89 |
| 53 | 8 | 4 | 1 | 2 | 1 | 4 | 82 | 112 | 100 | 85 |
| 54 | 8 | 4 | 2 | 0 | 1 | 1 | 12 | 104 | 126 | 76 |
| 55 | 7 | 1 | 0 | 1 | 1 | 4 | 0 | 9 | 114 | 66 |
| 56 | 4 | 3 | 2 | 0 | 1 | 3 | 113 | 103 | 71 | 73 |
| 57 | 4 | 4 | 0 | 0 | 0 | 4 | 28 | 101 | 19 | 65 |
| 58 | 3 | 3 | 2 | 2 | 1 | 4 | 22 | 100 | 80 | 115 |
| 59 | 2 | 1 | 1 | 2 | 0 | 5 | 99 | 95 | 99 | 5 |
| 60 | 5 | 2 | 1 | 0 | 1 | 3 | 105 | 123 | 118 | 125 |
| 61 | 8 | 4 | 1 | 1 | 1 | 3 | 120 | 49 | 45 | 49 |
| 62 | 8 | 2 | 0 | 1 | 0 | 3 | 66 | 68 | 41 | 118 |
| 63 | 5 | 4 | 2 | 1 | 0 | 4 | 80 | 22 | 7 | 100 |
| Loc | D | S | T | B | C | G | NA | PA | NS | PS |

FIG. 4

CACHE DIRECTORY (Continued)

| Loc | D | S | T | B | C | G | NA | PA | NS | PS |
|---|---|---|---|---|---|---|---|---|---|---|
| 64 | 8 | 3 | 2 | 1 | 1 | 3 | 73 | 96 | 73 | 110 |
| 65 | 6 | 4 | 2 | 1 | 1 | 4 | 101 | 48 | 57 | 111 |
| 66 | 8 | 1 | 1 | 2 | 0 | 3 | 108 | 62 | 55 | 68 |
| 67 | 2 | 3 | 0 | 2 | 1 | 5 | 17 | 27 | 98 | 27 |
| 68 | 6 | 1 | 2 | 2 | 1 | 3 | 62 | 3 | 66 | 3 |
| 69 | 5 | 1 | 2 | 2 | 1 | 2 | 124 | 2 | 103 | 11 |
| 70 | 9 | 1 | 2 | 2 | 0 | 4 | 112 | 85 | 112 | 44 |
| 71 | 3 | 3 | 1 | 0 | 0 | 3 | 118 | 116 | 84 | 56 |
| 72 | 5 | 0 | 1 | 2 | 1 | 4 | 15 | 4 | 106 | 29 |
| 73 | 7 | 3 | 0 | 2 | 1 | 3 | 18 | 64 | 56 | 64 |
| 74 | 2 | 2 | 2 | 0 | 1 | 1 | 40 | 8 | 31 | 8 |
| 75 | 4 | 0 | 0 | 1 | 1 | 4 | 117 | 109 | 26 | 22 |
| 76 | 2 | 4 | 2 | 1 | 1 | 1 | 104 | 98 | 54 | 40 |
| 77 | 2 | 2 | 2 | 1 | 0 | 4 | 109 | 80 | 109 | 30 |
| 78 | 9 | 3 | 1 | 1 | 0 | 4 | 94 | 37 | 27 | 117 |
| 79 | 2 | 3 | 2 | 0 | 1 | 4 | 115 | 14 | 115 | 92 |
| 80 | 5 | 3 | 2 | 0 | 0 | 4 | 77 | 63 | 117 | 58 |
| 81 | 8 | 4 | 2 | 1 | 0 | 3 | 116 | 88 | 116 | 105 |
| 82 | 3 | 2 | 2 | 1 | 1 | 4 | 36 | 53 | 36 | 15 |
| 83 | 7 | 4 | 1 | 1 | 0 | 3 | 3 | 121 | 122 | 32 |
| 84 | 6 | 3 | 1 | 2 | 0 | 3 | 121 | 32 | 9 | 71 |
| 85 | 9 | 4 | 0 | 0 | 0 | 4 | 70 | 15 | 53 | 23 |
| 86 | 6 | 2 | 2 | 2 | 0 | 5 | 33 | 5 | 95 | 94 |
| 87 | 9 | 2 | 1 | 1 | 0 | 2 | 96 | 43 | 125 | 34 |
| 88 | 1 | 0 | 1 | 0 | 1 | 3 | 81 | 105 | 120 | 18 |
| 89 | 8 | 1 | 0 | 0 | 0 | 4 | 38 | 35 | 52 | 25 |
| 90 | 1 | 0 | 1 | 1 | 1 | 4 | 52 | 23 | 29 | 38 |
| 91 | 7 | 0 | 0 | 2 | 1 | 2 | 31 | 124 | 96 | 2 |
| 92 | 3 | 3 | 1 | 1 | 0 | 4 | 44 | 21 | 79 | 21 |
| 93 | 7 | 2 | 2 | 1 | 1 | 4 | 37 | 26 | 37 | 50 |
| 94 | 6 | 2 | 2 | 0 | 0 | 4 | 51 | 78 | 86 | 37 |
| 95 | 7 | 2 | 2 | 0 | 0 | 5 | 59 | 17 | 8 | 86 |
| Loc | D | S | T | B | C | G | NA | PA | NS | PS |

FIG. 5

CACHE DIRECTORY (Continued)

| Loc | D | S | T | B | C | G | NA | PA | NS | PS |
|-----|---|---|---|---|---|---|-----|-----|-----|-----|
| 96  | 3 | 0 | 0 | 1 | 1 | 2 | 64  | 87  | 18  | 91  |
| 97  | 7 | 4 | 0 | 0 | 1 | 4 | 23  | 19  | 23  | 19  |
| 98  | 1 | 3 | 0 | 1 | 1 | 1 | 76  | 119 | 110 | 67  |
| 99  | 7 | 1 | 2 | 0 | 1 | 5 | 8   | 59  | 119 | 59  |
| 100 | 9 | 4 | 0 | 1 | 0 | 4 | 58  | 30  | 63  | 53  |
| 101 | 1 | 1 | 0 | 1 | 0 | 4 | 57  | 65  | 25  | 114 |
| 102 | 1 | 1 | 0 | 0 | 1 | 4 | 7   | 117 | 51  | 14  |
| 103 | 1 | 1 | 1 | 1 | 1 | 3 | 56  | 18  | 107 | 69  |
| 104 | 9 | 1 | 1 | 1 | 1 | 1 | 54  | 76  | 12  | 119 |
| 105 | 3 | 4 | 1 | 0 | 1 | 3 | 88  | 60  | 81  | 123 |
| 106 | 5 | 0 | 0 | 1 | 1 | 4 | 20  | 115 | 22  | 72  |
| 107 | 1 | 1 | 1 | 2 | 1 | 3 | 6   | 125 | 6   | 103 |
| 108 | 6 | 0 | 0 | 0 | 0 | 3 | 122 | 66  | 46  | 121 |
| 109 | 6 | 2 | 1 | 0 | 1 | 4 | 75  | 77  | 50  | 77  |
| 110 | 8 | 3 | 2 | 0 | 1 | 2 | 2   | 11  | 64  | 98  |
| 111 | 1 | 4 | 1 | 0 | 0 | 4 | 114 | 10  | 65  | 122 |
| 112 | 3 | 1 | 1 | 1 | 0 | 4 | 53  | 70  | 14  | 70  |
| 113 | 1 | 4 | 1 | 2 | 1 | 3 | 125 | 56  | 13  | 43  |
| 114 | 4 | 1 | 0 | 0 | 0 | 4 | 1   | 111 | 101 | 55  |
| 115 | 4 | 3 | 2 | 2 | 0 | 4 | 106 | 79  | 58  | 79  |
| 116 | 9 | 4 | 1 | 2 | 0 | 3 | 71  | 81  | 49  | 81  |
| 117 | 4 | 3 | 1 | 2 | 0 | 4 | 102 | 75  | 78  | 80  |
| 118 | 5 | 2 | 1 | 2 | 1 | 3 | 49  | 71  | 62  | 60  |
| 119 | 1 | 1 | 1 | 0 | 0 | 1 | 98  | 40  | 104 | 99  |
| 120 | 4 | 0 | 1 | 1 | 1 | 3 | 45  | 61  | 121 | 88  |
| 121 | 3 | 0 | 2 | 0 | 1 | 3 | 83  | 84  | 108 | 120 |
| 122 | 8 | 4 | 0 | 2 | 1 | 3 | 46  | 108 | 111 | 83  |
| 123 | 9 | 4 | 1 | 0 | 1 | 3 | 60  | 13  | 105 | 13  |
| 124 | 9 | 4 | 2 | 0 | 1 | 2 | 91  | 69  | 43  | 126 |
| 125 | 3 | 2 | 1 | 0 | 1 | 3 | 107 | 113 | 60  | 87  |
| 126 | 2 | 4 | 0 | 2 | 0 | 2 | 127 | 47  | 124 | 54  |
| 127 | 4 | 0 | 0 | 2 | 0 | 2 | 11  | 126 | 2   | 47  |
| Loc | D | S | T | B | C | G | NA  | PA  | NS  | PS  |

FIG. 6

LRU LIST

| Loc | D | S | T | B | C | G | NA | PA | NS | PS |
|---|---|---|---|---|---|---|---|---|---|---|
| 8 | 8 | 2 | 2 | 2 | 0 | 1 | 74 | 99 | 74 | 95 |
| 74 | 2 | 2 | 2 | 0 | 1 | 1 | 40 | 8 | 31 | 8 |
| 40 | 8 | 4 | 1 | 0 | 0 | 1 | 119 | 74 | 76 | 17 |
| 119 | 1 | 1 | 1 | 0 | 0 | 1 | 98 | 40 | 104 | 99 |
| 98 | 1 | 3 | 0 | 1 | 1 | 1 | 76 | 119 | 110 | 67 |
| 76 | 2 | 4 | 2 | 1 | 1 | 1 | 104 | 98 | 54 | 40 |
| 104 | 9 | 1 | 1 | 1 | 1 | 1 | 54 | 76 | 12 | 119 |
| 54 | 8 | 4 | 2 | 0 | 1 | 1 | 12 | 104 | 126 | 76 |
| 12 | 7 | 1 | 2 | 1 | 1 | 2 | 42 | 54 | 11 | 104 |
| 42 | 2 | 0 | 0 | 1 | 0 | 2 | 47 | 12 | 47 | 33 |
| 47 | 8 | 0 | 2 | 0 | 1 | 2 | 126 | 42 | 127 | 42 |
| 126 | 2 | 4 | 0 | 2 | 0 | 2 | 127 | 47 | 124 | 54 |
| 127 | 4 | 0 | 0 | 2 | 0 | 2 | 11 | 126 | 2 | 47 |
| 11 | 6 | 1 | 2 | 0 | 0 | 2 | 110 | 127 | 69 | 12 |
| 110 | 8 | 3 | 2 | 0 | 1 | 2 | 2 | 11 | 64 | 98 |
| 2 | 6 | 0 | 0 | 1 | 0 | 2 | 69 | 110 | 91 | 127 |
| 69 | 5 | 1 | 2 | 2 | 1 | 2 | 124 | 2 | 103 | 11 |
| 124 | 9 | 4 | 2 | 0 | 1 | 2 | 91 | 69 | 43 | 126 |
| 91 | 7 | 0 | 0 | 2 | 1 | 2 | 31 | 124 | 96 | 2 |
| 31 | 4 | 2 | 1 | 0 | 0 | 2 | 34 | 91 | 34 | 74 |
| 34 | 6 | 2 | 0 | 1 | 0 | 2 | 43 | 31 | 87 | 31 |
| 43 | 7 | 4 | 0 | 1 | 0 | 2 | 87 | 34 | 113 | 124 |
| 87 | 9 | 2 | 1 | 1 | 0 | 2 | 96 | 43 | 125 | 34 |
| 96 | 3 | 0 | 0 | 1 | 1 | 2 | 64 | 87 | 18 | 91 |
| 64 | 8 | 3 | 2 | 1 | 1 | 3 | 73 | 96 | 73 | 110 |
| 73 | 7 | 3 | 0 | 2 | 1 | 3 | 18 | 64 | 56 | 64 |
| 18 | 4 | 0 | 1 | 2 | 1 | 3 | 103 | 73 | 88 | 96 |
| 103 | 1 | 1 | 1 | 1 | 1 | 3 | 56 | 18 | 107 | 69 |
| 56 | 4 | 3 | 2 | 0 | 1 | 3 | 113 | 103 | 71 | 73 |
| 113 | 1 | 4 | 1 | 2 | 1 | 3 | 125 | 56 | 13 | 43 |
| 125 | 3 | 2 | 1 | 0 | 1 | 3 | 107 | 113 | 60 | 87 |
| 107 | 1 | 1 | 1 | 2 | 1 | 3 | 6 | 125 | 6 | 103 |
| Loc | D | S | T | B | C | G | NA | PA | NS | PS |

FIG. 7

LRU LIST (Continued)

| Loc | D | S | T | B | C | G | NA  | PA  | NS  | PS  |
|-----|---|---|---|---|---|---|-----|-----|-----|-----|
| 6   | 9 | 1 | 0 | 2 | 0 | 3 | 13  | 107 | 3   | 107 |
| 13  | 8 | 4 | 0 | 1 | 1 | 3 | 123 | 6   | 123 | 113 |
| 123 | 9 | 4 | 1 | 0 | 1 | 3 | 60  | 13  | 105 | 13  |
| 60  | 5 | 2 | 1 | 0 | 1 | 3 | 105 | 123 | 118 | 125 |
| 105 | 3 | 4 | 1 | 0 | 1 | 3 | 88  | 60  | 81  | 123 |
| 88  | 1 | 0 | 1 | 0 | 1 | 3 | 81  | 105 | 120 | 18  |
| 81  | 8 | 4 | 2 | 1 | 0 | 3 | 116 | 88  | 116 | 105 |
| 116 | 9 | 4 | 1 | 2 | 0 | 3 | 71  | 81  | 49  | 81  |
| 71  | 3 | 3 | 1 | 0 | 0 | 3 | 118 | 116 | 84  | 56  |
| 118 | 5 | 2 | 1 | 2 | 1 | 3 | 49  | 71  | 62  | 60  |
| 49  | 9 | 4 | 1 | 1 | 0 | 3 | 61  | 118 | 61  | 116 |
| 61  | 8 | 4 | 1 | 1 | 1 | 3 | 120 | 49  | 45  | 49  |
| 120 | 4 | 0 | 1 | 1 | 1 | 3 | 45  | 61  | 121 | 88  |
| 45  | 6 | 4 | 1 | 0 | 0 | 3 | 32  | 120 | 32  | 61  |
| 32  | 8 | 4 | 2 | 2 | 0 | 3 | 84  | 45  | 83  | 45  |
| 84  | 6 | 3 | 1 | 2 | 0 | 3 | 121 | 32  | 9   | 71  |
| 121 | 3 | 0 | 2 | 0 | 1 | 3 | 83  | 84  | 108 | 120 |
| 83  | 7 | 4 | 1 | 1 | 0 | 3 | 3   | 121 | 122 | 32  |
| 3   | 9 | 1 | 2 | 0 | 1 | 3 | 68  | 83  | 68  | 6   |
| 68  | 6 | 1 | 2 | 2 | 1 | 3 | 62  | 3   | 66  | 3   |
| 62  | 8 | 2 | 0 | 1 | 0 | 3 | 66  | 68  | 41  | 118 |
| 66  | 8 | 1 | 1 | 2 | 0 | 3 | 108 | 62  | 55  | 68  |
| 108 | 6 | 0 | 0 | 0 | 0 | 3 | 122 | 66  | 46  | 121 |
| 122 | 8 | 4 | 0 | 2 | 1 | 3 | 46  | 108 | 111 | 83  |
| 46  | 2 | 0 | 1 | 0 | 0 | 4 | 41  | 122 | 48  | 108 |
| 41  | 7 | 2 | 1 | 1 | 0 | 4 | 9   | 46  | 0   | 62  |
| 9   | 5 | 3 | 1 | 1 | 0 | 4 | 55  | 41  | 10  | 84  |
| 55  | 7 | 1 | 0 | 1 | 1 | 4 | 0   | 9   | 114 | 66  |
| 0   | 5 | 2 | 0 | 0 | 1 | 4 | 10  | 55  | 16  | 41  |
| 10  | 5 | 3 | 2 | 1 | 0 | 4 | 111 | 0   | 1   | 9   |
| 111 | 1 | 4 | 1 | 0 | 0 | 4 | 114 | 10  | 65  | 122 |
| 114 | 4 | 1 | 0 | 0 | 0 | 4 | 1   | 111 | 101 | 55  |
| Loc | D | S | T | B | C | G | NA  | PA  | NS  | PS  |

FIG. 8

LRU LIST (Continued)

| Loc | D | S | T | B | C | G | NA | PA | NS | PS |
|-----|---|---|---|---|---|---|-----|-----|-----|-----|
| 1   | 9 | 3 | 2 | 0 | 0 | 4 | 48  | 114 | 28  | 10  |
| 48  | 4 | 0 | 1 | 0 | 1 | 4 | 65  | 1   | 38  | 46  |
| 65  | 6 | 4 | 2 | 1 | 1 | 4 | 101 | 48  | 57  | 111 |
| 101 | 1 | 1 | 0 | 1 | 0 | 4 | 57  | 65  | 25  | 114 |
| 57  | 4 | 4 | 0 | 0 | 0 | 4 | 28  | 101 | 19  | 65  |
| 28  | 2 | 3 | 1 | 2 | 1 | 4 | 16  | 57  | 35  | 1   |
| 16  | 7 | 2 | 0 | 2 | 0 | 4 | 24  | 28  | 24  | 0   |
| 24  | 4 | 2 | 0 | 1 | 1 | 4 | 25  | 16  | 4   | 16  |
| 25  | 8 | 1 | 1 | 0 | 0 | 4 | 35  | 24  | 89  | 101 |
| 35  | 3 | 3 | 0 | 0 | 1 | 4 | 89  | 25  | 39  | 28  |
| 89  | 8 | 1 | 0 | 0 | 0 | 4 | 38  | 35  | 52  | 25  |
| 38  | 9 | 0 | 2 | 1 | 0 | 4 | 19  | 89  | 90  | 48  |
| 19  | 2 | 4 | 0 | 0 | 1 | 4 | 97  | 38  | 97  | 57  |
| 97  | 7 | 4 | 0 | 0 | 1 | 4 | 23  | 19  | 23  | 19  |
| 23  | 6 | 4 | 1 | 1 | 0 | 4 | 90  | 97  | 85  | 97  |
| 90  | 1 | 0 | 1 | 1 | 1 | 4 | 52  | 23  | 29  | 38  |
| 52  | 4 | 1 | 0 | 2 | 1 | 4 | 39  | 90  | 44  | 89  |
| 39  | 4 | 3 | 2 | 1 | 1 | 4 | 21  | 52  | 21  | 35  |
| 21  | 9 | 3 | 1 | 2 | 0 | 4 | 92  | 39  | 92  | 39  |
| 92  | 3 | 3 | 1 | 1 | 0 | 4 | 44  | 21  | 79  | 21  |
| 44  | 3 | 1 | 1 | 2 | 1 | 4 | 29  | 92  | 70  | 52  |
| 29  | 7 | 0 | 0 | 0 | 0 | 4 | 4   | 44  | 72  | 90  |
| 4   | 9 | 2 | 1 | 2 | 1 | 4 | 72  | 29  | 15  | 24  |
| 72  | 5 | 0 | 1 | 2 | 1 | 4 | 15  | 4   | 106 | 29  |
| 15  | 6 | 2 | 0 | 0 | 1 | 4 | 85  | 72  | 82  | 4   |
| 85  | 9 | 4 | 0 | 0 | 0 | 4 | 70  | 15  | 53  | 23  |
| 70  | 9 | 1 | 2 | 2 | 0 | 4 | 112 | 85  | 112 | 44  |
| 112 | 3 | 1 | 1 | 1 | 0 | 4 | 53  | 70  | 14  | 70  |
| 53  | 8 | 4 | 1 | 2 | 1 | 4 | 82  | 112 | 100 | 85  |
| 82  | 3 | 2 | 2 | 1 | 1 | 4 | 36  | 53  | 36  | 15  |
| 36  | 9 | 2 | 1 | 0 | 0 | 4 | 14  | 82  | 20  | 82  |
| 14  | 8 | 1 | 1 | 1 | 0 | 4 | 79  | 36  | 102 | 112 |
| Loc | D | S | T | B | C | G | NA | PA | NS | PS |

FIG. 9

LRU LIST (Continued)

| Loc | D | S | T | B | C | G | NA | PA | NS | PS |
|-----|---|---|---|---|---|---|-----|-----|-----|-----|
| 79 | 2 | 3 | 2 | 0 | 1 | 4 | 115 | 14 | 115 | 92 |
| 115 | 4 | 3 | 2 | 2 | 0 | 4 | 106 | 79 | 58 | 79 |
| 106 | 5 | 0 | 0 | 1 | 1 | 4 | 20 | 115 | 22 | 72 |
| 20 | 5 | 2 | 0 | 1 | 1 | 4 | 30 | 106 | 30 | 36 |
| 30 | 5 | 2 | 0 | 2 | 1 | 4 | 100 | 20 | 77 | 20 |
| 100 | 9 | 4 | 0 | 1 | 0 | 4 | 58 | 30 | 63 | 53 |
| 58 | 3 | 3 | 2 | 2 | 1 | 4 | 22 | 100 | 80 | 115 |
| 22 | 6 | 0 | 0 | 2 | 0 | 4 | 63 | 58 | 75 | 106 |
| 63 | 5 | 4 | 2 | 1 | 0 | 4 | 80 | 22 | 7 | 100 |
| 80 | 5 | 3 | 2 | 0 | 0 | 4 | 77 | 63 | 117 | 58 |
| 77 | 2 | 2 | 2 | 1 | 0 | 4 | 109 | 80 | 109 | 30 |
| 109 | 6 | 2 | 1 | 0 | 1 | 4 | 75 | 77 | 50 | 77 |
| 75 | 4 | 0 | 0 | 1 | 1 | 4 | 117 | 109 | 26 | 22 |
| 117 | 4 | 3 | 1 | 2 | 0 | 4 | 102 | 75 | 78 | 80 |
| 102 | 1 | 1 | 0 | 0 | 1 | 4 | 7 | 117 | 51 | 14 |
| 7 | 2 | 4 | 1 | 0 | 1 | 4 | 50 | 102 | 17 | 63 |
| 50 | 3 | 2 | 1 | 2 | 0 | 4 | 26 | 7 | 93 | 109 |
| 26 | 9 | 0 | 1 | 2 | 0 | 4 | 93 | 50 | 33 | 75 |
| 93 | 7 | 2 | 2 | 1 | 1 | 4 | 37 | 26 | 37 | 50 |
| 37 | 9 | 2 | 0 | 2 | 1 | 4 | 78 | 93 | 94 | 93 |
| 78 | 9 | 3 | 1 | 1 | 0 | 4 | 94 | 37 | 27 | 117 |
| 94 | 6 | 2 | 2 | 0 | 0 | 4 | 51 | 78 | 86 | 37 |
| 51 | 7 | 1 | 1 | 0 | 1 | 4 | 5 | 94 | 5 | 102 |
| 5 | 3 | 1 | 0 | 0 | 0 | 4 | 86 | 51 | 59 | 51 |
| 86 | 6 | 2 | 2 | 2 | 0 | 5 | 33 | 5 | 95 | 94 |
| 33 | 5 | 0 | 0 | 0 | 0 | 5 | 27 | 86 | 42 | 26 |
| 27 | 6 | 3 | 0 | 0 | 1 | 5 | 67 | 33 | 67 | 78 |
| 67 | 2 | 3 | 0 | 2 | 1 | 5 | 17 | 27 | 98 | 27 |
| 17 | 1 | 4 | 0 | 0 | 0 | 5 | 95 | 67 | 40 | 7 |
| 95 | 7 | 2 | 2 | 0 | 0 | 5 | 59 | 17 | 8 | 86 |
| 59 | 2 | 1 | 1 | 2 | 0 | 5 | 99 | 95 | 99 | 5 |
| 99 | 7 | 1 | 2 | 0 | 1 | 5 | 8 | 59 | 119 | 59 |
| Loc | D | S | T | B | C | G | NA | PA | NS | PS |

FIG. 10

DESTAGE CONTROL VALUES

| LRU Group g | Max # Cache Locs in Group g | Current # Cache Locs in Group g | Counters for # of Dirty Blocks by LRU Group g and Segment Sn | | | | | | Dirty Total | All LRU Start | All LRU End |
|---|---|---|---|---|---|---|---|---|---|---|---|
| | | | S0 | S1 | S2 | S3 | S4 | S5 | | | |
| G1 | 8 | 8 | 0 | 1 | 1 | 1 | 2 | 0 | 5 | 8 | 54 |
| G2 | 16 | 16 | 4 | 2 | 0 | 1 | 1 | 0 | 8 | 12 | 96 |
| G3 | 32 | 32 | 4 | 4 | 3 | 3 | 6 | 0 | 20 | 64 | 122 |
| G4 | 64 | 64 | 4 | 5 | 10 | 5 | 5 | 0 | 29 | 46 | 5 |
| G5 | 8 | 8 | 0 | 1 | 0 | 2 | 0 | 0 | 3 | 86 | 99 |
| Total | 128 | 128 | 12 | 13 | 14 | 12 | 14 | 0 | 65 | 8 | 99 |
| FwdG5 | 33 | -1 | S5 | S0 | S4 | S1 | S3 | S2 | -1 | S3 | S4 |
| BwdG5 | 1 | -1 | S1 | S3 | S5 | S4 | S2 | S0 | -1 | -1 | -1 |
| FwdG4 | 45 | -1 | S5 | S4 | S3 | S1 | S0 | S2 | -1 | S2 | S5 |
| BwdG4 | 15 | -1 | S4 | S3 | S5 | S2 | S1 | S0 | -1 | -1 | -1 |
| Sg Start | -1 | -1 | 42 | 119 | 8 | 98 | 40 | -1 | -1 | -1 | -1 |
| Sg End | -1 | -1 | 33 | 99 | 95 | 67 | 17 | -1 | -1 | -1 | -1 |

FIG. 11

DISK STATUS TABLE

| Disk i | Current Disk Arm Position Cylinder (Segment) $A_i(m)$ | Current Estimated Read Request Disk Utilization $U_i(n)$ |
|---|---|---|
| Disk 1 | 4 | .25 |
| Disk 2 | 2 | .09 |
| Disk 3 | 0 | .18 |
| Disk 4 | 1 | .37 |
| Disk 5 | 3 | .04 |
| Disk 6 | 0 | .11 |
| Disk 7 | 3 | .03 |
| Disk 8 | 3 | .21 |
| Disk 9 | 4 | .14 |

FIG. 12

INITIAL DISK LAYOUT

| Segment | 3 | 3 | 3 | 3 | 3 | 3 | 3 | 3 | 3 | |
|---|---|---|---|---|---|---|---|---|---|---|
| Track | 0 | 0 | 0 | 1 | 1 | 1 | 2 | 2 | 2 | |
| Block | 0 | 1 | 2 | 0 | 1 | 2 | 0 | 1 | 2 | $U_i(n)$ |
| Disk 4 | x | x | x | x | x | x | x | x | x | .37 |
| Disk 1 | x | x | x | x | x | x | x | x | x | .25 |
| Disk 8 | P | P | P | S | S | S | x | x | x | .21 |
| Disk 3 | x | x | x | x | x | x | x | x | x | .18 |
| Disk 9 | S | S | S | x | x | x | x | x | x | .14 |
| Disk 6 | x | x | x | x | x | x | P | P | P | .11 |
| Disk 2 | x | x | x | x | x | x | x | x | x | .09 |
| Disk 5 | x | x | x | x | x | x | x | x | x | .04 |
| Disk 7 | x | x | x | P | P | P | S | S | S | .03 |

FIG. 13

FINAL DISK LAYOUT

| | Segment | 3 | 3 | 3 | 3 | 3 | 3 | 3 | 3 | 3 | | Must | Write |
|---|---|---|---|---|---|---|---|---|---|---|---|---|---|
| | Track | 0 | 0 | 0 | 1 | 1 | 1 | 2 | 2 | 2 | | | |
| | Block | 0 | 1 | 2 | 0 | 1 | 2 | 0 | 1 | 2 | | D | P |
| | | | | | | | | | | | | | |
| Disk 4 | | x | x | x | x | x | 0 | 2 | 4 | 0 | | 1 | 0 |
| Disk 1 | | x | 2 | x | x | x | x | x | x | x | | 0 | 0 |
| Disk 8 | | P | P | P | S | S | S | 2 | 2 | x | | 0 | 2 |
| Disk 3 | | 4 | x | x | 0 | 0 | x | x | x | 4 | | 2 | 0 |
| Disk 9 | | S | S | S | x | 0 | 0 | 0 | x | x | | 0 | 0 |
| Disk 6 | | 5 | x | x | x | x | 0 | P | P | P | | 1 | 3 |
| Disk 2 | | x | x | 5 | x | x | 4 | 4 | x | x | | 3 | 0 |
| Disk 5 | | x | x | x | x | 0 | x | 0 | 0 | x | | 0 | 0 |
| Disk 7 | | x | x | 2 | P | P | P | S | S | S | | 0 | 1 |
| | | | | | | | | | | | | | |
| | | 2 | 1 | 2 | 1 | 3 | 4 | 5 | 3 | 2 | | In-cache | |
| | | 2 | 0 | 1 | 0 | 0 | 1 | 1 | 1 | 1 | | Destage | |

FIG. 14

REVISED DISK LAYOUT

| Segment | 3 | 3 | 3 | 3 | 3 | 3 | 3 | 3 | 3 | Must | Write |
|---|---|---|---|---|---|---|---|---|---|---|---|
| Track | 0 | 0 | 0 | 1 | 1 | 1 | 2 | 2 | 2 | | |
| Block | 0 | 1 | 2 | 0 | 1 | 2 | 0 | 1 | 2 | D | P |
| Disk 4 | x | x | x | x | x | 0 | 2 | 2 | 0 | 0 | 0 |
| Disk 1 | x | 2 | x | x | x | x | x | x | x | 0 | 0 |
| Disk 8 | P | P | P | S | S | S | 2 | 2 | x | 0 | 2 |
| Disk 3 | 4 | x | x | 0 | 0 | x | x | x | 4 | 2 | 0 |
| Disk 9 | S | S | S | x | 0 | 0 | 0 | x | x | 0 | 0 |
| Disk 6 | 5 | x | x | x | x | 0 | P | P | P | 1 | 3 |
| Disk 2 | x | x | 5 | x | x | 4 | 4 | x | x | 3 | 0 |
| Disk 5 | x | x | x | x | 0 | x | 0 | 0 | x | 0 | 0 |
| Disk 7 | x | x | 2 | P | P | P | S | S | S | 0 | 1 |
| | 2 | 1 | 2 | 1 | 3 | 4 | 5 | 3 | 2 | In-cache | |
| | 2 | 0 | 1 | 0 | 0 | 1 | 1 | 0 | 1 | Destage | |

FIG. 15

DESTAGE SEQUENCE FOR
SEGMENT S3

|  | 1st Revolution | | | | | | | | | 2nd Revolution | | | | | | | | | Must Write | |
|---|---|---|---|---|---|---|---|---|---|---|---|---|---|---|---|---|---|---|---|---|
| Segment | 3 | 3 | 3 | 3 | 3 | 3 | 3 | 3 | 3 | 3 | 3 | 3 | 3 | 3 | 3 | 3 | 3 | 3 | | |
| Track | 0 | 0 | 0 | 1 | 1 | 1 | 2 | 2 | 2 | 0 | 0 | 0 | 1 | 1 | 1 | 2 | 2 | 2 | | |
| Block | 0 | 1 | 2 | 0 | 1 | 2 | 0 | 1 | 2 | 0 | 1 | 2 | 0 | 1 | 2 | 0 | 1 | 2 | D | P |
| Disk 4 | | | | | | | | | | | | | | | | | | | 1 | 0 |
| Disk 1 | | | | | | | | | | | | | | | | | | | 0 | 0 |
| Disk 8 | R | r | | | | | | | | W | w | | | | | | | | 0 | 2 |
| Disk 3 | r | | | | R | | | | | w | | | | | | | W | | 2 | 0 |
| Disk 9 | | | | | | | | | | | | | | | | | | | 0 | 0 |
| Disk 6 | r | | | R | r | | | | | w | | | | | | W | w | | 1 | 3 |
| Disk 2 | | R | | r | r | | | | | | | | W | w | w | | | | 3 | 0 |
| Disk 5 | | | | | | | | | | | | | | | | | | | 0 | 0 |
| Disk 7 | | | R | | | | | | | | | W | | | | | | | 0 | 1 |

FIG. 16

INITIAL DISK LAYOUT

| Segment | 2 | 2 | 2 | 2 | 2 | 2 | 2 | 2 | 2 | |
|---|---|---|---|---|---|---|---|---|---|---|
| Track | 0 | 0 | 0 | 1 | 1 | 1 | 2 | 2 | 2 | |
| Block | 0 | 1 | 2 | 0 | 1 | 2 | 0 | 1 | 2 | $U_i(n)$ |
| Disk 4 | x | x | x | x | x | x | x | x | x | .37 |
| Disk 1 | x | x | x | P | P | P | S | S | S | .25 |
| Disk 8 | x | x | x | x | x | x | x | x | x | .21 |
| Disk 3 | S | S | S | x | x | x | x | x | x | .18 |
| Disk 9 | x | x | x | x | x | x | P | P | P | .14 |
| Disk 6 | x | x | x | x | x | x | x | x | x | .11 |
| Disk 2 | P | P | P | S | S | S | x | x | x | .09 |
| Disk 5 | x | x | x | x | x | x | x | x | x | .04 |
| Disk 7 | x | x | x | x | x | x | x | x | x | .03 |

FIG. 17

FINAL DISK LAYOUT

| Segment | 2 | 2 | 2 | 2 | 2 | 2 | 2 | 2 | 2 | Must | Write |
|---|---|---|---|---|---|---|---|---|---|---|---|
| Track | 0 | 0 | 0 | 1 | 1 | 1 | 2 | 2 | 2 | | |
| Block | 0 | 1 | 2 | 0 | 1 | 2 | 0 | 1 | 2 | D | P |
| Disk 4 | x | 4 | x | 0 | x | x | x | x | x | 1 | 0 |
| Disk 1 | x | x | x | P | P | P | S | S | S | 0 | 2 |
| Disk 8 | x | 0 | x | x | x | x | x | x | 0 | 0 | 0 |
| Disk 3 | S | S | S | 2 | x | 0 | x | 4 | x | 1 | 0 |
| Disk 9 | x | x | 4 | 0 | 0 | 4 | P | P | P | 2 | 1 |
| Disk 6 | 4 | 0 | x | 4 | x | x | 0 | x | 0 | 2 | 0 |
| Disk 2 | P | P | P | S | S | S | 2 | 0 | x | 0 | 3 |
| Disk 5 | 4 | 4 | 4 | 2 | x | 2 | x | x | x | 3 | 0 |
| Disk 7 | x | x | 0 | x | 0 | x | 0 | 4 | x | 1 | 0 |
| | 2 | 4 | 3 | 5 | 2 | 3 | 3 | 3 | 2 | In-cache | |
| | 2 | 2 | 2 | 1 | 0 | 1 | 0 | 2 | 0 | Destage | |

FIG. 18

REVISED DISK LAYOUT

| Segment | 2 | 2 | 2 | 2 | 2 | 2 | 2 | 2 | 2 | Must | Write |
|---|---|---|---|---|---|---|---|---|---|---|---|
| Track   | 0 | 0 | 0 | 1 | 1 | 1 | 2 | 2 | 2 | | |
| Block   | 0 | 1 | 2 | 0 | 1 | 2 | 0 | 1 | 2 | D | P |
| Disk 4 | x | 2 | x | 0 | x | x | x | x | x | 0 | 0 |
| Disk 1 | x | x | x | P | P | P | S | S | S | 0 | 2 |
| Disk 8 | x | 0 | x | x | x | x | x | x | 0 | 0 | 0 |
| Disk 3 | S | S | S | 2 | x | 0 | x | 4 | x | 1 | 0 |
| Disk 9 | x | x | 4 | 0 | 0 | 4 | P | P | P | 2 | 1 |
| Disk 6 | 4 | 0 | x | 4 | x | x | 0 | x | 0 | 2 | 0 |
| Disk 2 | P | P | P | S | S | S | 2 | 0 | x | 0 | 3 |
| Disk 5 | 4 | 4 | 4 | 2 | x | 2 | x | x | x | 3 | 0 |
| Disk 7 | x | x | 0 | x | 0 | x | 0 | 4 | x | 1 | 0 |
|  | 2 | 4 | 3 | 5 | 2 | 3 | 3 | 3 | 2 | In-cache | |
|  | 2 | 1 | 2 | 1 | 0 | 1 | 0 | 2 | 0 | Destage | |

FIG. 19

DESTAGE SEQUENCE FOR
SEGMENT S2

|  | 1st Revolution | | | | | | | | 2nd Revolution | | | | | | | | Must Write | |
|---|---|---|---|---|---|---|---|---|---|---|---|---|---|---|---|---|---|---|
| Segment | 2 | 2 | 2 | 2 | 2 | 2 | 2 | 2 | 2 | 2 | 2 | 2 | 2 | 2 | 2 | 2 | | |
| Track | 0 | 0 | 0 | 1 | 1 | 1 | 2 | 2 | 0 | 0 | 0 | 1 | 1 | 1 | 2 | 2 | | |
| Block | 0 | 1 | 2 | 0 | 1 | 2 | 0 | 1 | 0 | 1 | 2 | 0 | 1 | 2 | 0 | 1 | D | P |
| Disk 4 | | | | | | | | | | | | | | | | | 1 | 0 |
| Disk 1 | | | | R | | | | | | | | W | w | | | | 0 | 2 |
| Disk 8 | | R | | | | | | | | | | | | | | | 0 | 0 |
| Disk 3 | | | | | R | | | | | | | | | | W | | 1 | 0 |
| Disk 9 | | R | | r | | r | | | | W | | | w | | w | | 2 | 1 |
| Disk 6 | R | | | | | | | | W | | w | | | | | | 2 | 0 |
| Disk 2 | R | r | r | | | | | | W | w | w | | | | | | 0 | 3 |
| Disk 5 | R | r | r | | | | | | W | w | w | | | | | | 3 | 0 |
| Disk 7 | | | R | | r | | | | | | | | | | W | | 1 | 0 |

FIG. 20

DESTAGING MODIFIED DATA BLOCKS FROM CACHE MEMORY

BACKGROUND OF THE INVENTION

1. Field of the Invention

This invention relates generally to computing system data storage subsystems having cache memory and, more particularly, to destaging modified data blocks from a cache memory.

2. Description of the Related Art

Computing systems frequently are provided with storage subsystems having multiple storage devices connected to the computing system central processor through a device controller. For example, some computing systems include a plurality of disks arranged into a disk array with parity and sparing. Parity refers to organizing data into parity groups such that each modification of disk data that involves a relatively small write operation requires a read old data, read old parity, write new data, write new parity sequence of operations often referred to as a read-modify-write sequence. Sparing refers to providing spare data blocks to be used in the event of a disk failure. A disk array controller is provided between the disk array and the computing system central processor unit (CPU) and includes a non-volatile cache memory.

A cache memory provides a fast, limited-size temporary storage for data and can reduce the number of times a disk must be accessed to retrieve a requested data block. As applications running in the central processor unit request blocks of data from the disk array, the disk array controller checks a cache directory to determine if a copy of the requested data block is in the cache memory of the controller. If the disk array controller determines that the cache memory contains the most recent copy of the data block, referred to as a cache hit, then the controller provides the data block to a requesting application from the cache memory rather than from the particular disk where the data block is located.

If the most recent copy of the data block is not in the cache memory, referred to as a cache miss, then the disk array controller consults the cache memory directory to find a cache memory location containing a block that can be replaced, or overwritten, because the data in that location also resides on a disk. The controller reads a copy of the requested data block from the disk and puts it in the cache memory location to be overwritten. Lastly, the controller updates the cache directory to indicate that the old data block is no longer in the cache memory location and that the new data block has taken its place. Once the new data block is in the cache memory, it can be modified and updated.

Disk arrays with cache memory are desirable because they increase efficiency of expensive computing systems by reducing the number of times data blocks must be accessed from a disk. Accesses of data from a disk are typically slower than accesses of data from a cache memory. Therefore, getting data from a cache memory permits a computing system to carry out processing faster than is possible when getting the data from a disk. This increased efficiency reduces the cost of operations.

As described above, as applications update blocks of data with new data values, the disk array controller writes the new data values into the data block copies in the cache memory. When a new data value is written to a data block copy in the cache memory, the cache copy is said to be modified, or dirty, because the information stored in the cache memory copy is different from the information stored for the data block on disk. There is no urgency to return the dirty data block to the disk before a power interruption or the like because the cache memory is non-volatile and therefore the modified data will not be lost. It is important, however, to return a dirty block to disk before it is replaced or overwritten with a new data block, because the modified data otherwise would be lost.

It can be useful to keep dirty blocks in cache memory for as long as possible for a variety of reasons. First of all, if applications write again and again to the same data block, then the writing operation can take place between the CPU and the cache memory rather than between the CPU and the disk array. Thus, no disk read/write operation is necessary. In this way, disk access operations are reduced and storage system efficiency is increased. Secondly, if dirty blocks are kept in cache for some time, then groups of dirty blocks can be returned to disk locations during the same disk operation, with the read-modify-write sequence of parity operations multiplexed and overlapped to minimize disk utilization. Again, disk accesses are reduced and efficiency is increased.

Writing dirty blocks from cache memory back to their corresponding disk locations is known as destaging. As noted above, such destaging must take place before a data value can be overwritten in the cache memory. A disk controller with a cache memory includes a cache manager that controls the destaging. Most conventional destaging schemes are relatively simple and utilize a least-recently-used (LRU) ordering of the cache memory locations. An LRU ordering of the cache memory can be represented as a stack in which the most recently used data block cache locations are at the top of the stack and the least recently used, or oldest, data blocks are at the bottom of the stack. A typical cache manager would begin destaging dirty blocks when a predetermined percentage of the cache locations contain dirty blocks, such as 50%, and would begin destaging from the bottom of the stack, with the oldest data blocks being returned to disk first.

Other schemes for determining when to begin destaging also are used. For example, some cache managers begin destaging when a particular data block becomes the least recently used block (the bottom of the stack). Other cache managers might begin destaging when a particular disk has not had a read request within a specified time interval, such as within the previous ten milliseconds. Still other cache managers might begin destaging when a disk has not moved its read/write arm within a specified time interval. Typically, such destaging schemes seek to maximize cache hit rates or minimize disk queue wait times. In either case, the goal is to provide relatively fast response to read requests.

Several schemes also are used to determine when to stop destaging. Most are analogous to the scheme used to determine when to begin destaging. In the first example given above for beginning when the percentage of dirty cache blocks is greater than a first predetermined number, the cache manager would stop destaging when the percentage of dirty blocks falls below a second predetermined number. Similarly, other schemes might stop destaging when a read request is received by a disk that was previously in the process of destaging. Once again, the goal is to provide good response times to read requests.

The decision of what blocks are to be destaged from cache memory is usually straightforward. For example, a typical cache manager might destage a predetermined number of blocks in order of least recently used blocks (from the bottom of the stack and up). Alternatively, a cache manager might destage all dirty blocks that are close together physically on a disk or might destage the LRU data block at the bottom of the stack and all other dirty blocks that are physically close to it on the same disk. The manner in which destaging is carried out also is relatively straightforward, comprising either a read-modify-write sequence or, alternatively, a read-remainder of parity group, write new data, write new parity sequence. Usually, the selection is made depending on which sequence requires less work by the disk system.

The destaging schemes described above tend to be invariant. That is, the cache manager is provided with one relatively simple decision criteria for determining when to begin destaging, what to destage, when to stop destaging, and how to carry out the destaging. Utilization of various cache memory locations and storage devices can change with time. It would be advantageous to provide a more flexible approach to controlling destaging that can adapt to changing cache memory usage, provides good response times to requests for disk reads, and maximizes cache hit rates. It also would be desirable to provide increased efficiency in destaging by taking into account the geographic location of blocks within the storage devices so that the number of storage device operations necessary for destaging is reduced.

From the discussion above, it should be apparent that there is a need for a storage system that permits increased flexibility in controlling destaging and provides increased system efficiency. The present invention satisfies this need.

SUMMARY OF THE INVENTION

In accordance with the invention, a controller for a redundant storage device array with parity includes a non-volatile cache memory and controls destaging data blocks from the cache memory to the storage devices by dividing the cache memory into memory location groups according to least-recently-used (LRU) status and dividing the storage device array into memory location segments extending across the storage devices. The controller begins the destaging process in the event that the number of dirty blocks in a predetermined LRU group exceeds a predetermined number. The controller destages the dirty blocks from the segment having the greatest number of dirty blocks. The dirty blocks can be restricted to the predetermined LRU group or can be selected from across all LRU groups in the segment. The controller halts the destaging process when the number of dirty blocks in the predetermined LRU group falls below a second predetermined value. As the cache memory usage changes, the data blocks comprising the predetermined LRU group can change as well. The controller will continue to order the blocks according to the predetermined LRU groups, begin destaging when the number of dirty blocks from the predetermined LRU group exceeds an upper threshold value, beginning with the segment having the greatest number of dirty blocks, and will halt destaging when the number of dirty blocks in the LRU group drops below a lower threshold value. In this way, the controller both maximizes the cache hit ratio and minimizes storage device utilization in response to changing cache memory usage.

In one aspect of the invention, the storage device array controller divides the cache memory into multiple LRU groups such that the LRU group having the cache memory locations containing the oldest data is the smallest LRU group, divides the storage device array into multiple segments of equal size, and then decides when to begin destaging by monitoring the number of dirty blocks in the two LRU groups containing the oldest data. If the number of dirty blocks in either LRU group exceeds a predetermined upper threshold value, then the controller begins destaging. Each LRU group can be assigned a different upper threshold value. The controller decides what to destage by identifying the storage device segment having the greatest number of cache memory dirty blocks and begins destaging dirty blocks in the cache memory from that segment. If desired, the controller can restrict destaging to those dirty blocks that came from that segment and that are in either of the two monitored LRU groups. The controller halts destaging when the number of dirty blocks in the LRU group that initiated destaging falls below a predetermined lower threshold value. Each LRU group can be assigned a different lower threshold value.

In another aspect of the invention, the controller maintains metrics concerning storage device utilization and determines how to destage dirty blocks by considering storage device utilization rates. The controller will not permit particular storage devices having utilization rates above a predetermined value to participate in destaging. The controller also can consider the physical location of blocks in the storage devices and maintain storage device layout tables to more easily determine which blocks in a given segment will be destaged.

Other features and advantages of the present invention should be apparent from the following description of the preferred embodiment, which illustrates, by way of example, the principles of the invention.

BRIEF DESCRIPTION OF THE DRAWINGS

FIG. 2 is a representation of the disk array illustrated in FIG. 1 showing the configuration of the data.

FIGS. 3, 4, 5, and 6 are representations of portions of the cache directory for the cache memory illustrated in FIG. 1.

FIGS. 7, 8, 9 and 10 are representations of the data illustrated in FIGS. 3–6 organized in order of least recently used memory locations.

FIG. 11 is a representation of destage control values used by the array controller illustrated in FIG. 1 to control destaging.

FIG. 12 is a representation of a disk status table used by the array controller illustrated in FIG. 1 to control destaging.

FIGS. 13, 14, and 15 represent a segment layout table that is used by the array controller to determine what blocks will be destaged.

FIG. 16 is a destage sequence table illustrating the sequence of destaging read and write operations indicated by FIG. 15.

FIGS. 17, 18, and 19 represent a segment layout table illustrating an alternative destaging scheme from FIGS. 13–15.

FIG. 20 is a destage sequence table illustrating the sequence of destaging read and write operations indicated by FIG. 19.

DESCRIPTION OF THE PREFERRED EMBODIMENT

Figure 1:
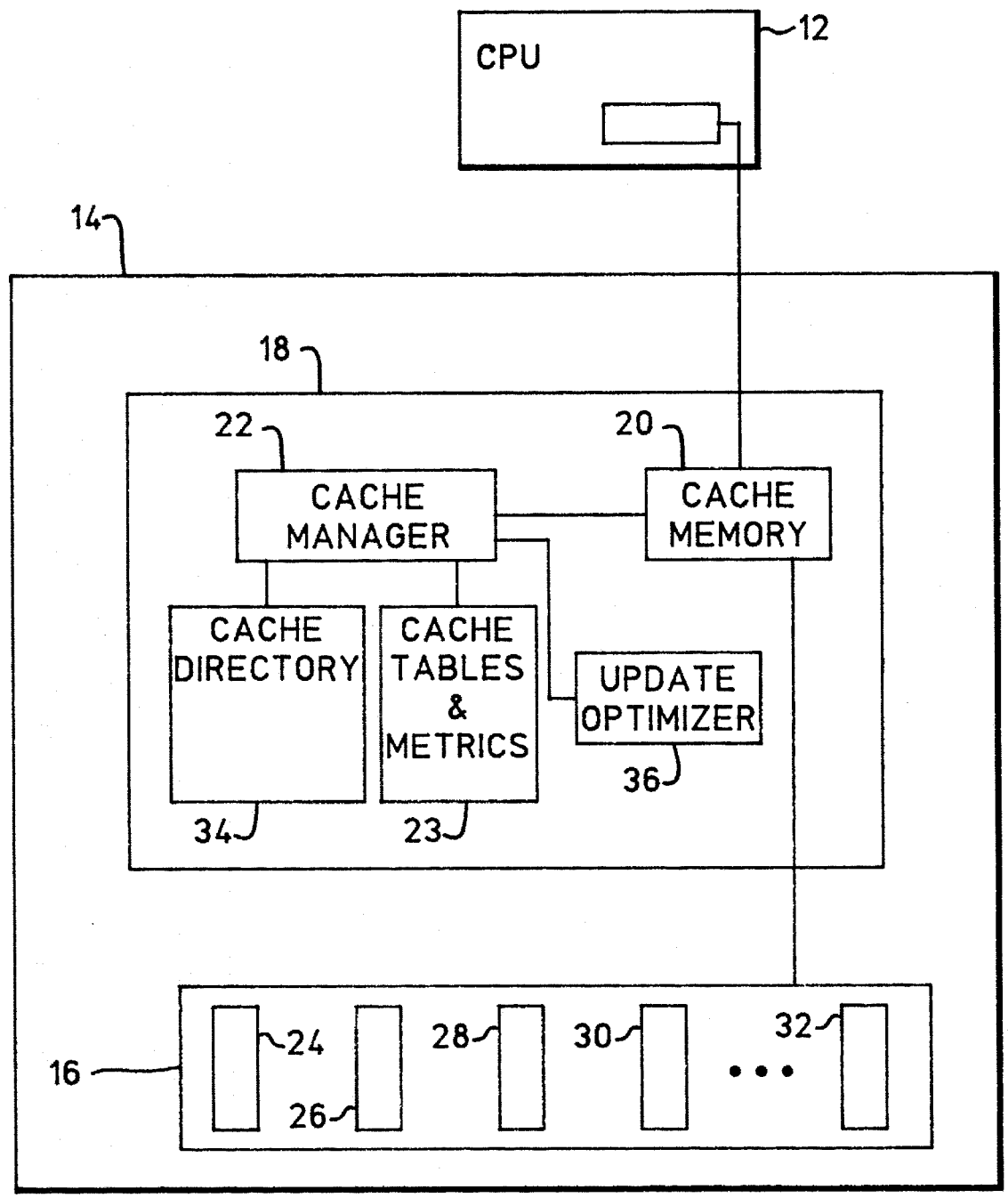
FIG. 1 is a block diagram of a computing system constructed in accordance with the present invention.

FIG. 1 shows a computing system 10 constructed in accordance with the present invention. The computing system includes a central processor unit (CPU) 12 and a storage subsystem 14 having a storage device array 16 connected to the CPU through an array controller 18. The storage devices of the array 16 store blocks of data for use by applications running in the CPU. The controller 18 includes a non-volatile cache memory 20 in which copies of some of the array data blocks are temporarily stored for use by the applications. When the data block copies in the cache memory are modified from their corresponding storage device values, they become "dirty" blocks and are periodically written back to the storage device array storage locations from which they came, a process known as destaging. The controller includes a cache manager 22 that the controller uses to control the destaging process. More particularly, the cache manager divides the cache memory 20 into multiple least-recently-used (LRU) groups of memory locations and begins destaging when the number of dirty data blocks in one of the LRU groups exceeds a predetermined upper threshold value. Data concerning the dirty blocks and other storage subsystem metrics are maintained in tables 23 kept by the cache manager 22. In this way, the controller can adapt to computing system operations, provide good response times to requests for storage device reads, and maximize cache hit rates. The controller also can provide increased efficiency in destaging by taking into account the geographic location of the corresponding storage device blocks so that the number of storage device operations necessary for destaging is reduced, as described further below.

The storage devices of the array 16 can comprise, for example, a plurality of large mainframe-compatible International Business Machines Corporation (IBM Corporation) Model 3390 magnetic disk drives or smaller SCSI-format IBM Corporation Model 0663-H12 disk drives, or may comprise magnetic tape drives, semiconductor memory units, or the like. In FIG. 1, only five disk drive units 24, 26, 28, 30, and 32 are shown for simplicity. The disk drives provide data to the CPU 12, which can comprise, for example, a large mainframe computer processor, such as an IBM Corporation Model 370 or 390, or can comprise a smaller machine, such as an IBM Corporation Model RS6000 workstation or an IBM Corporation PC or PS/2 personal computer. The cache memory 20 can comprise, for example, a battery backed-up volatile semiconductor memory.

FIG. 2 is a representation of a storage location layout of the storage device array 16 illustrated in FIG. 1 that indicates the status of corresponding blocks in the cache memory 20. FIG. 2 shows that, in the exemplary computing system illustrated in FIG. 1, the storage devices of the array comprise nine magnetic disk drive units whose storage locations are divided by the array controller into six segments designated S0, S1, S2, S3, S4, and S5. In the preferred embodiment, the disk drive units are organized as a redundant array with distributed parity, commonly referred to as a Type 5 RAID (Redundant Arrays of Inexpensive Disks) implementation. Each segment represents a subdivision of the array storage locations across disk drives.

For example, in the illustrated embodiment the segments represent cylinders of disk storage locations. Each disk drive unit 24, 26, 28, 30, 32 contains several platters, each platter having two recording surfaces. The segments can be thought of as the disk storage locations that are located in concentric circles of a given radius across all of the disk drive units. Thus, segment S0 represents the disk storage locations found at a radius r on each recording surface of all nine disk drive units. In this way, a single segment subdivision extends across multiple storage device units. The terms "disk drive unit" and "disk" shall be used interchangeably.

FIG. 2 shows that the disk drive storage locations are further divided into three tracks per segment, the tracks being designated 0, 1, and 2, with each track having storage locations further divided into three blocks numbered 0, 1, and 2. Some of the blocks on each disk are reserved for parity information, other blocks are reserved as spare blocks to be used if a disk in the array fails, and the remainder of the blocks are used to hold data. It is to be understood that this subdivision is for purposes of illustration only and that many other arrangements can be used without departing from the teachings of the invention.

The blocks in the FIG. 2 representation of the disk drives are labeled "P" if they are parity blocks, are labeled "S" if they are spare blocks, and are labeled with "x", "0", "1", or "*" if they are for holding data. At the particular point in time represented by FIG. 2, some of the data blocks are contained in corresponding blocks in the non-volatile cache memory 20 by the cache manager 22. These blocks are labeled "0" or "1", where a "0" designates that the corresponding cache memory block contains information that is identical to the information in the storage device block on disk and a "1" designates that the information in the cache memory block is different from the information in the block on disk. That is, a "0" designates that the data block contained in the cache memory has not been modified by an application and a "1" designates that the information has been modified by one or more write commands from an application running in the CPU 12. In FIG. 2, data blocks designated with an "x" mean that the data block is not currently contained in the cache memory 20 and blocks designated with a "*" mean that the data block has been allocated to contain data but currently no application is using that block to hold any data.

As known to those skilled in the art, data blocks in the cache memory 20 are called "dirty" if the information contained in them is not identical to the information stored in the corresponding blocks on disk. Thus, dirty blocks are represented in FIG. 2 by a "1". Data blocks in the cache memory are called "clean" if the information in them has not been modified by an application program since they were last read from or written to one of the disks. Thus, clean blocks are represented in FIG. 2 by a "0". Cache memory blocks remain dirty until they are destaged, or written back to disk, when they become clean.

Thus, FIG. 2 represents a situation in which sixty-three data blocks in segment S5 are labeled with an asterisk (*) and therefore contain no information. In segments S0 through S4, FIG. 2 shows that a total of sixty-five data blocks are labeled with a "1" and therefore are contained in the cache memory 20 and are dirty, while sixty-three data blocks are labeled with a "0" and therefore are contained in the cache memory and are clean. One hundred ninety-six data blocks are not currently in the cache memory and therefore are labeled with an "x". FIG. 2 shows that fifty-four blocks are labeled with a "P" and therefore contain parity information, while fifty-four blocks are labeled with an "S" and therefore are reserved as spare blocks.

Each vertical column in the FIG. 2 disk layout table for disks 1 through 9 represents a parity group. For example, column 1 indicates that the block at disk 8, segment S0, track 0, block 0 contains a parity block for data in segment S0, track 0, block 0 on disks 1 through 9. The second column of disk 5 in segment S1 indicates that the block at disk 5, segment S1, track 0, block 1 contains parity information for data in segment S1, track 0, block 1 on disks 1 through 9. The parity blocks and spare blocks can be distributed according to a variety of distribution schemes. The parity and spare blocks can be distributed, for example, in accordance with the distributed sparing scheme described in the co-pending U.S. patent application entitled "Distributed Sparing with Uniform Workload Distribution on Failures" assigned Ser. No. 08/173,441 filed Dec. 23,1993 and to IBM Corporation by J. Menon.

In FIG. 2, the row labeled "No. DBkP" contains the number of dirty blocks in each respective parity group or column. The row labeled "No. DBkS" contains the total number of dirty blocks over all parity groups within a given segment number. Finally, the row labeled "%DBkS" contains the percentage of dirty blocks in a given segment. For the situation illustrated in FIG. 2, segments S2 and S4 have the highest percentage of dirty blocks at 10.94%.

The cache memory 20 illustrated in FIG. 1 contains memory locations divided into one hundred twenty-eight blocks. Those skilled in the art will appreciate that typical cache memory contains many more locations. The number of locations in the illustrated cache memory 20 is for purposes of illustration only. FIGS. 3, 4, 5, and 6 represent different portions of a cache LRU directory 34 maintained by the cache manager 22. For each memory location block in the cache memory, the cache directory indicates which data block from the disk array 16 is contained in the cache memory block. Each row in the cache directory also includes several data fields, in FIG. 3 designated with the headings D, S, T, B, C, G, NA, PA, NS, and PS. These data fields represent, respectively, the disk drive number, segment number, track number, and block number of the original storage device data block, an indicator flag of whether the cache memory block is clean or dirty, an LRU group number described further below, a next-LRU-block location field, a previous-LRU-block location field, a next in-segment LRU block location field, and a previous in-segment LRU block location field, respectively.

For example, FIGS. 3–6 indicate that cache memory location 0 (FIG. 3) currently stores a copy of the data block located at disk 5, segment S2, track 0, block 0. The C value is 1, which indicates that the block is dirty. The LRU group number is 4. The NA and PA values indicate that the data block stored in cache memory location 10 was last used less recently and the data block stored in cache memory location 55 was last used more recently, respectively, relative to the data block stored in cache memory location 0. The NS and PS values indicate that, of the cache memory blocks from the same segment (segment S2), the data block stored in cache memory location 16 was last used less recently, and the data block stored in cache memory location 41 was last used more recently, relative to the data block stored in cache memory location 0.

Similarly, FIGS. 3–6 indicate that cache memory location 45 (FIG. 4) currently stores a copy of the data block located at disk 6, segment S4, track 1, block 0. The C value is 0, which indicates that the block is clean. The LRU group number is 3. The NA and PA values indicate that the data block stored in cache memory location 32 was last used less recently and the data block stored in cache location 120 was last used more recently, relative to the data block stored in cache memory location 45. The NS and PS values indicate that, of the cache memory blocks from the same segment (segment S4), the data block stored in cache memory location 32 was last used less recently and the data block stored in cache memory location 61 was last used more recently, relative to the data block stored in cache memory location 45.

FIGS. 7, 8, 9, and 10 show the cache LRU directory 34 ordered according to least recently used (LRU) cache memory location with the location of the most recently used cache memory location at the top of the list (top row in FIG. 7) and the least recently used cache memory location at the bottom of the list (bottom of FIG. 10). The information in FIGS. 7–10 otherwise is identical to that illustrated in FIGS. 3–6. As is readily apparent from FIGS. 7–10, the cache manager 22 organizes the cache memory locations into five LRU groups. In the preferred embodiment, the cache manager maintains only the cache LRU directory 34 as the LRU-ordered list of FIGS. 7–10; the location-ordered list of FIGS. 3–6 is provided for convenience in locating statistics concerning particular memory locations.

FIG. 7 shows that LRU group 1 corresponds to the first eight rows of the LRU list and that LRU group 2 corresponds to the next sixteen rows of the LRU list. FIGS. 7 and 8 show that LRU group 3 corresponds to the next thirty-two rows of the LRU list. FIGS. 8, 9, and 10 show that LRU group 4 corresponds to the next sixty-four rows of the LRU list. Finally, FIG. 10 shows that LRU group 5 corresponds to the last eight rows of the LRU list. Thus, LRU group 1 contains the eight most recently used cache memory locations, LRU group 2 contains the sixteen next most recently used cache memory locations, LRU group 3 contains the thirty-two next most recently used cache memory locations, LRU group 4 contains the sixty-four next most recently used cache memory locations, and LRU group 5 contains the eight least recently used cache memory locations.

In the preferred embodiment, the LRU group having the cache memory locations containing the oldest data is the smallest LRU group. Thus, FIGS. 7–10 indicate that the LRU group with the oldest dam, LRU group 5, contains the eight least recently used cache memory locations. In particular, the size of the oldest LRU group, LRU group 5, is selected such that it is sufficiently small to ensure that all dirty blocks in the LRU group eventually will be destaged. This is done to ensure that the oldest data in the cache memory 20 does not migrate to the bottom of the LRU list and remain there without being destaged because, for example, it is geographically isolated from other dirty blocks and is bypassed in destaging due to utilization or location criteria, as described below.

For example, as will be described more fully below, the controller decides when to begin destaging based on the percentage of dirty blocks in LRU group 5. To prevent frequent destaging that would unnecessarily load the computing system with activity, the upper destaging threshold for dirty blocks might need to be so great that, for a large LRU group 5, dirty blocks could remain in the cache memory for quite some time. In accordance with the invention, the size of the oldest LRU group is selected so as to ensure that the oldest dirty blocks in the cache memory will periodically be destaged. The size of the next-to-largest LRU group is not so restricted. For example, as dirty blocks remain in LRU group 4 and become aged, they eventually are moved into LRU group 5 and then will, eventually, be destaged.

The number of LRU groups and their relative sizes are selected in concert with the selection of the number of segment groups and predetermined threshold values to obtain the benefits of the invention. In the preferred embodiment, the threshold values are referred to as Ta, Tb, Tc, and Td and are described further below. In view of this description of the preferred embodiment, those skilled in the art will be able to select the combination of LRU groups and segment groups to obtain the benefits of the invention.

Further improvement also may be obtained with a minimum of experimentation. For example, for the illustrated configuration, the inventors have found that dividing the storage device array 16 into six segments and dividing the cache memory 20 into five LRU groups of the indicated relative sizes provides improved system efficiency. Other combinations of group numbers and sizes are possible, but best results are obtained when either the number of LRU groups or the number of segments, or both, is greater than one.

The NA and PA fields associated with a row of the LRU list of FIGS. 7–10 are used to maintain the LRU list as a double-linked list with the NA field giving the next cache memory location in the list and the PA field giving the previous cache memory location in the LRU list. Thus, the PA entry (previous-LRU block location field) of the first row in the LRU list points to the last row in the list and the NA entry (next-LRU block location field) of the last row in the LRU list points to the first row. Similarly, for each segment, the NS and PS fields associated with a row of the LRU list are used to maintain the LRU list as a double-linked list. The NS field provides the next row or cache memory location in the LRU list from the same segment and the PS field gives the previous row or cache memory location in the LRU list from the same segment. Thus, the PS field of the first row points to the last same-segment row in the LRU list and the NS field of the last row points to the first same-segment row in the LRU list.

One of the cache tables 23 maintained by the cache manager 22 is the Destage Control Values table illustrated in FIG. 11. The destage control values are values used by the cache manager to control the destaging process and to maintain the LRU list of FIGS. 7–10. In the FIG. 11 table, null values of (–1) indicate that no valid entry exists at that table location. That is, the Destage Control Values table illustrated in FIG. 11 contains a total of twelve rows with eleven fields each, for a total of 132 data fields, and data fields that are not used are filled with a null value set to (–1).

The first column of the first five rows of the Destage Control Values table of FIG. 11 contains the LRU group number. For clarity with respect to other data values, the LRU groups 0–5 will be designated by G0, G1, . . . , G5. The next column of the first five rows of the table gives the maximum number of cache memory locations that can be in the LRU group of the respective table row. The next column of the first five rows gives the current number of cache memory locations that are in the corresponding LRU group, followed in the next six columns by the number of dirty blocks for each one of the segments. The next column of the first five rows of the Destage Control Values table gives the total number of dirty blocks in each respective LRU group, followed by columns for the cache memory location that starts the LRU group and the cache memory location that ends the LRU group.

In FIG. 11, the row of the Destage Control Values table marked "Total" provides, in the first column field, the maximum number of data blocks in the cache memory 20, and then the total current number of blocks in the cache memory. Thus, FIG. 11 indicates that the cache memory is completely full. The next six entries in the "Total" row contain the total number of dirty blocks in each one of the storage device segments, followed by entries for the total number of dirty blocks in the cache memory, the cache memory location that starts the LRU list, and the cache memory location that ends the LRU list.

For example, referring to the row corresponding to LRU group G4 in the Destage Control Values table illustrated in FIG. 11, there are a maximum of sixty-four cache memory locations in group G4, there are sixty-four cache memory locations currently used in group G4, four of the currently used cache memory locations have dirty blocks and are from segment S0, five of the cache memory locations have dirty blocks and are from segment S1, ten of the cache memory locations have dirty blocks and are from segment S2, five of the cache memory locations have dirty blocks and are from segment S3, five of the cache memory locations have dirty blocks and are from segment S4, and zero of the cache memory locations have dirty blocks and are from segment S5, for a total of twenty-nine dirty blocks in LRU group G4. Finally, the Destage Control Values table indicates that LRU group G4 starts at cache memory location 46 and ends at cache memory location 5.

The next four rows of the Destage Control Values table of FIG. 11 refer to LRU groups G4 and G5. The first data field in the row of the table labeled "FwdG5" provides a dirty block percentage upper threshold value "Ta" (described further below) that is used by the cache manager 22 to determine when to begin destaging. In FIG. 11, Ta=33. The next field in the row is set to a null value (–1) to indicate no valid data is contained in that table location, and the next six fields provide values that indicate which storage device segments in LRU group G5 have the same or next fewer number of dirty blocks. That is, the cache manager lists the segments in order of the number of dirty blocks so that each segment number is listed only once. If two or more segments have the same number of dirty blocks, then the cache manager will choose one of the segments randomly, in turn. Alternatively, the cache manager can use a scheme that selects the first segment with the same or fewer number of dirty blocks.

For example, in FIG. 11, segment S0 has zero dirty blocks in LRU group G5 and the segment with the next fewer dirty blocks is any one of S2, S4, or S5, each with zero dirty blocks. One of those segments is selected and, therefore, the FwdG5 row indicates that segment S5 has the next fewer number of dirty blocks than segment S0. Segment S1 has one dirty block in LRU group G5 and segments S0, S2, S4, and S5 have the next fewer number of dirty blocks, with zero. Again, one of those segments will be selected. The FwdG5 row indicates that the cache manager has arbitrarily selected segment S0 as having the next fewer number of dirty blocks in LRU group G5 than segment S1. Similarly, the cache manager has selected segment S4 as having the next fewer number of dirty blocks than segment S2, segment S1 the next fewer dirty blocks than segment S3, segment S3 the next fewer dirty blocks than segment S4, and segment S2 the next fewer dirty blocks than segment S5. The next field in the FwdG5 row is set to a null value (–1). The next field in the FwdG5 row indicates the segment having the greatest number of dirty blocks in LRU group G5 (segment S3) and the last field in the row indicates the segment having the fewest number of dirty blocks in LRU group G5 (segment S4). Again, if more than one segment has the same number, one is selected for the FwdG5 row.

The next row in the Destage Control Values table of FIG. 11 is labeled "BwdG5" and provides a dirty block lower threshold value "Tb", described further below, that is used by the cache manager 22 to determine when to stop the destaging process. In FIG. 11, Tb=1. The next field in the row is set to a null value (–1). The next group of six fields provides values that indicate which segments in LRU group G5 have the same or next larger number of dirty blocks. Again, if two or more segments have the same number of dirty blocks, then the cache manager will choose one of the segments randomly, in turn, so that each segment number is listed only once. For example, the fields in FIG. 11 indicate that segment S1 has the next greater number of dirty blocks than segment S0, segment S3 has the next greater number of dirty blocks than segment S1, segment S5 has the next greater number of dirty blocks than segment S2, segment S4 has the next greater number of dirty blocks than segment S3, segment S2 has the next greater number of dirty blocks than segment S4, and finally, segment S0 has the next greater number of dirty blocks than segment S5. The remaining fields in the BwdG5 row are set to null values.

Comparing the fields in the FwdG5 and BwdG5 rows of the FIG. 11 table, the cache manager 22 can determine, for example, that segment SO has the next fewer number of dirty blocks than does segment S1, while segment S3 has the next greater number of dirty blocks than does segment S1. Thus, the values in the FwdG5 row and BwdG5 row form a double-linked list among the segments with the list order being determined by how many dirty blocks from LRU group G5 are in each segment. The segment with the most dirty blocks is at the top of the list and the segment with the fewest number of dirty blocks is at the bottom of the list.

The next two rows of the Destage Control Values table of FIG. 11 are labeled "FwdG4" and "BwdG4". These rows contain the same information as the previous two rows, except that the values apply to LRU group G4 rather than LRU group G5. The last two rows of the Destage Control Values table are labeled "Sg Start" and "Sg End". The fields in these two rows are all set to null values except for listings under the segment columns, which indicate the starting and ending cache memory locations for the LRU list for each respective segment. Thus, the LRU list for segment S4 starts at cache memory location 40 and ends at cache memory location 17. That is, the least recently used cache memory location corresponding to a data block from segment S4 is at cache memory location 40, while the oldest least recently used cache memory location for a data block corresponding to a memory location in segment S4 is at cache memory location 17. These values can be confirmed by referring to the LRU list of FIGS. 3–6 or FIGS. 7–10.

The cache manager 22 uses the information contained in the LRU list of FIGS. 7–10 to determine what dirty blocks should be destaged. It is possible to implement a variety of different schemes. For example, the cache manager can destage all dirty blocks in LRU groups G4 and G5, or can destage all dirty blocks in segment S4, or can destage all dirty blocks that are in both LRU groups G4 or G5 and in segments S1 or S3. Furthermore, if all dirty blocks in LRU groups G4 or G5 and segments S1 or S3 are to be destaged, then the cache manager can determine the additional work needed to destage dirty blocks in LRU groups G4 or G5 and in segment S2 and, based on the result, can choose to destage those additional segment S2 blocks at the same time. The scheme used by the preferred embodiment is described below.

Another one of the cache tables and metrics 23 maintained by the cache manager 22 is the Disk Status table illustrated in FIG. 12. The cache manager can use the information contained in the Disk Status table to determine the manner in which destaging should be carried out. The cache manager uses an update parity group optimizer 36 illustrated in FIG. 1 to destage dirty blocks in such a manner that the increase in disk utilization rate is kept to a weighted average value. The increase to a disk with a low estimated read request utilization is maintained greater than the increase to a disk with a high estimated read request utilization.

The Disk Status table illustrated in FIG. 12 contains a row for each disk of the storage device array 16 and contains two columns for each disk. The first column lists Ai(m), which is the arm position of disk (i) after a read or write request (m) is started. The last column lists Ui(n), the current estimated read request disk utilization rate of disk (i) just after a read request (n) to disk (i) ends. As known to those skilled in the art, such information will be known to the cache manager because it will generate the read and write requests and direct disk arm movement to known locations. The cache manager therefore will be able to order the read and write operations for maximum efficiency. The details of producing such an ordering are known to those skilled in the art.

In the preferred embodiment, the cache manager 22 begins destaging dirty blocks when either (1) the number of dirty blocks in the least recently used LRU group G5 exceeds a first predetermined upper threshold value or (2) the number of dirty blocks in the next-to-least recently used LRU group G4 exceeds a second predetermined upper threshold value, whichever is satisfied first. As described above, the predetermined values for beginning and halting destaging are specified by Ta, Tb, Tc, and Td entries in the Destage Control Values table (FIG. 11 ). These values are preferably determined experimentally, but those skilled in the art likely can estimate values that will provide reasonable performance.

In particular, the first alternative above specifies that the cache manager 22 will begin destaging when the number of dirty blocks in LRU group G5 exceeds a number that is equivalent to the Ta value specified in the FwdG5 row of the Destage Control Values table and will continue destaging until the number of dirty blocks in LRU group G5 is less than the value specified by the Tb entry in the BwdG5 row of the table. According to the second alternative, the cache manager will begin destaging dirty blocks when the number of dirty blocks in LRU group G4 exceeds a value specified by the Tc entry in the FwdG4 row of the Destage Control Values table and will continue destaging until the number of dirty blocks is less than a value specified by the Td entry in the BwdG4 row of the table. In the preferred embodiment, the Ta, Tb, Tc, and Td values are given in terms of a percentage of dirty blocks in the respective LRU groups.

In the example illustrated in FIG. 11, both of the alternatives specified above are satisfied. In FIG. 11, Ta=33 and Tc=45. The total number of dirty blocks in LRU group G5 is three blocks, out of a current number of cache locations equal to eight blocks. Thus, three out of the eight blocks in G5 are dirty, which is greater than 33%, which is the Ta threshold value. With respect to LRU group G4, the Destage Control Values table indicates that there are a total of twenty-nine dirty blocks out of sixty-four cache memory location blocks in LRU group G4. Thus, twenty-nine out of sixty-four blocks in group G4 are dirty blocks, or 45%, which is equal to the value specified for Tc in the table.

The Ta, Tb, To, and Td values are selected in accordance with the system configuration and operational characteristics to provide destaging sufficiently often to ensure that the oldest data in the cache memory 20 is periodically destaged, but not so often that the system 10 becomes bogged down with destaging operations. The inventors have found that the illustrated values for Ta, Tb, To, and Td provide satisfactory results, in accordance with the relative sizes of the two least-recently-used LRU groups. In particular, as noted above, Ta is selected so that LRU group G5 will be destaged at a desired frequency and Tb is selected so that, once the controller begins destaging LRU group GS, the controller will continue until all dirty blocks in LRU group G5 are destaged. Thus, in FIG. 11, the lower threshold value is set such that Tb=1. The size of LRU group G4 and the Tc value are selected such that temporary increases in the total number of dirty blocks in the cache memory do not trigger too-frequent destaging, but overall levels of dirty blocks are maintained at satisfactory levels.

Next, if the cache manager 22 decides to begin destaging based on the first alternative, which is the number of dirty blocks in LRU group GS, then the cache manager will inspect the Destage Control Values table to determine the segment number with the most dirty blocks in LRU group G5. In the case of the FIG. 11 exemplary values, the entry in the "All LRU Start" field of the FwdG5 row has the value S3. Thus, segment S3 has the most dirty blocks in LRU group G5. Therefore, the cache manager will destage all dirty blocks that are from segment S3 and in LRU groups G5 and G4.

The cache manager 22 need not destage all of the dirty blocks in LRU groups G5 and G4 that meet the requirements specified above. The cache manager can determine exactly which ones of the dirty blocks are to be destaged after considering disk utilization rates from examination of the Destage Control Values table. The cache manager first constructs an initial layout table of segment S3, such as illustrated in FIG. 13.

FIG. 13 indicates the location of the parity and spare blocks in segment S3 by placing a "P" or "S" at appropriate locations, respectively. The cache manager 22 indicates locations that have no data blocks in the cache memory 20 by placing an "x" code at the appropriate location. In the initial layout illustrated in FIG. 13, the cache manager orders the disks according to the current estimate of the read request disk utilization, Ui(n), which is determined from FIG. 12. In the FIG. 13 example, disk 4 is the most utilized disk (37 percent) and disk 7 is the least utilized (3 percent).

With reference to FIG. 11, the S3 entry in the "Sg Start" column indicates that segment S3 begins at cache memory location 98 and the entry in the row "Sg End" indicates that segment S3 ends at cache memory location 67. Consulting the cache directory of FIGS. 3–6, the cache manager 22 determines that the table entry for cache memory location 67 indicates that a block on disk 2, segment S3, track 0, block 2, is a dirty block and is in LRU group G5. Therefore, this block must be destaged because the threshold value Ta has been reached. The cache manager therefore modifies the layout table illustrated in FIG. 13 to mark the corresponding block with a "5" to indicate that the block is in LRU group G5 and should be destaged. The modification appears in the final disk layout table illustrated in FIG. 14.

Referring again to the cache directory of FIGS. 3–6, the "PS" field in the row for cache memory location 67 indicates that cache memory location 27 is the previous LRU cache memory block from segment S3. Referring next to the cache directory table row for cache memory location 27, the cache manager 22 can determine that a block on disk 6, segment S3, track 0, block 0 is dirty and also is in LRU group G5. Therefore, the cache manager also will destage this block. Once again, the cache manager modifies the initial layout table illustrated in FIG. 13 to mark the corresponding block with a "5" to indicate belonging to group G5 and requiring destaging. This modification can be seen in the final disk layout table illustrated in FIG. 14.

The cache manager 22 next returns again to the cache directory 34 of FIGS. 3–6 and examines the row for cache memory location 27. The entry for column "PS" in cache memory location 27 indicates that cache memory location 78 is the previous LRU cache memory block in segment S3. Therefore, the cache manager examines cache memory location 78 to determine that a block on disk 9, segment S3, track 1, block 1 is a clean block and is in LRU group G4. Because the block is clean, it should not be destaged and therefore the cache manager marks the corresponding block in the layout table with a "0" to indicate this fact. The modification can be seen in the final layout table illustrated in FIG. 14.

Next, the cache manager 22 examines the cache directory (FIGS. 3–6) for cache memory location 78 and determines that the column entry for "PS" indicates that cache memory location 117 is the previous LRU cache memory block in segment S3. Therefore, the cache manager examines cache memory location 117 and determines that a block on disk 4, segment S3, track 1, block 2 is a clean block and should not be destaged. The cache manager modifies the initial layout table of FIG. 13 to mark the corresponding block with a "0" to indicate a clean block and no destaging, which is reflected in the final layout table illustrated in FIG. 14.

In this way, the cache manager 22 continues examining the data blocks that are in the cache memory 20 and are in LRU groups G4 and G5 by modifying the initial layout table to mark corresponding blocks with a "0" if the data block is clean, "2" if the data block is dirty but is not in LRU groups G4 or G5, and "4" or "5" if the data block is dirty and is in LRU group G4 or G5, respectively. The cache manager stops the process when cache memory location 98 has been processed, because that memory location is the beginning of the segment S3 list (the segment with the greatest number of dirty blocks in LRU group G5) and therefore all items in the list will have been processed.

The final layout table constructed by the cache manager 22 is illustrated in FIG. 14. The number of blocks from each respective track and block in segment S3 that are in the cache memory are listed at the bottom of FIG. 14 in the row labeled "In-Cache" and the number of blocks that are to be destaged from each respective track and block of segment S3 are listed in the "Destagep" row at the bottom of FIG. 14. The minimum number of data and parity block write operations to each respective disk are listed at the right side of FIG. 14 under the columns marked "Must Write" and designated with a "D" and a "P" for data and parity, respectively.

Each parity block that must be written to a disk can be formed by the controller 14 in one of two ways, either by a read-modify-write sequence or by a read-parity-group sequence. In the read-modify-write sequence, old copies of data blocks that have been modified and an old copy of the corresponding parity block are read into a buffer memory and are subjected to the exclusive-or logical operator (XOR) with the new copies of the modified data blocks to form a new parity block. The new data blocks and the new parity block are then written to the corresponding locations in the storage device disk array 16. In the read-parity-group sequence, all data blocks in a parity group having modified blocks to be destaged that are not in the cache memory are read into a buffer memory and a new parity block is formed by using the XOR operator on all of the data blocks. The new data blocks and the new parity block are then written to corresponding locations in the disk array.

The cache manager 22 chooses between the read-modify-write sequence and the read-parity-group sequence according to which scheme requires the fewest number of disk operations. In the preferred embodiment, the cache manager also chooses subject to not carrying out a read or write operation in support of destaging to any disk that has a read utilization of greater than a predetermined value specified by U1%. If a disk has a utilization rate of less than U1% but greater than U2% then the cache manager will not read from or write to the disk in support of destaging if destaging would add more than a predetermined amount of busy time (specified by Z). Finally, the cache manager will permit read and write operations in support of destaging to any disk having a read utilization rate of less than U2%. Those skilled in the art will recognize that these restrictions do not apply to system-generated read operations.

For example, if U1=30, U2=20, and Z=20, then the block on disk 4 marked with a "4" that should be destaged (FIG. 14) will not be destaged because disk 4 is 37% utilized (FIG. 12), a value greater than U1, and no write operation is permitted. Two parity blocks on disk 8 (FIG. 14) are part of parity groups for dirty blocks that must be destaged (track 0, blocks 0 and 2). These parity blocks must be read and then written under read-modify-write because disk 4 cannot be used for the second alternative above (read-parity-group sequence). The remaining disks indicated in FIG. 14 can either be read, written, or both because they are under 20% utilized, a value less than U2.

The cache manager 22 determines the processing to be followed by first examining disk 4. Because disk 4 is utilized at over the amount specified by U1, modified blocks from segment S3 and disk 4 are not destaged and are marked with a "2" to indicate that they are in the cache memory 20 and are dirty but are not to be destaged. This is illustrated in the revised layout table of FIG. 15. Next, because disk 1 is utilized at a rate greater than U2, no additional read operations that would add busy time of 20 ms should be added to disk 1. Because none of the parity groups having modified blocks to destage have a data block from disk 1 in the cache memory 20, all destaging must be done via the read-modify-write strategy.

The sequence of required read and write operations are illustrated in FIG. 16, where "R" is the first block to be read on each disk and, if present, the remaining "r" blocks are read in the same input/output operation or disk revolution. After all read operations are completed, the write operations can begin where "W" is the first data block to be written on each disk and, if present, the remaining "w" blocks are written in the same input/output operation or disk revolution. If additional modified blocks need to be destaged, the process is repeated until a sufficient number of blocks have been destaged.

Returning to FIG. 11, if the cache manager 22 begins destaging because the number of dirty blocks in LRU group G4 is greater than the number specified by the Tc value, the second alternative named above, then the cache manager examines the table of FIG. 11 to determine the segment having the most dirty blocks in LRU group G4. For the values given in FIG. 11, the entry in the "All LRU Start" column for the FwdG4 row is S2. This indicates that segment S2 has the most dirty blocks in LRU group G4 and therefore all dirty blocks in segment S2 and in LRU groups G4 or G5 should be destaged. Again, to determine precisely which blocks are to be destaged, the cache manager 22 examines the Destage Control Values table illustrated in FIG. 11 and also the cache directory illustrated in FIGS. 3–6. Analogous to the sequence of operations if destaging due to the Ta value, when the cache manager begins destaging due to the Tc value, the cache manager first makes an initial layout table for the segment having the greatest number of dirty blocks in group G4, segment S2. The S2 initial layout table is illustrated in FIG. 17. Again, parity and spare blocks are indicated by "P" and "S", respectively, and data blocks that are not in the cache memory are indicated by an "x" code. Again, the disks are ordered according to the current estimate of the read request disk utilization, Ui(n), given in FIG. 12, with disk 4 being the most utilized and disk 7 being the least utilized for the exemplary values illustrated.

Referring again to FIG. 11, the entry in the "S2" column for the "Sg Start" row indicates to the cache manager 22 that the LRU list for segment S2 begins at cache memory location 95 and ends at cache memory location 8. Referring to FIGS. 3–6, the table row for cache memory location 95 (FIG. 5) indicates that a block from disk 7, segment S2, track 2, block 0 is in LRU group G5 but is clean. Therefore, this cache memory block will not be destaged and the corresponding block in the initial layout table is modified to have a "0" value to indicate the fact that it is clean and should not be destaged. The final layout table is illustrated in FIG. 18. Next, the table row in the cache directory for cache memory location 95 indicates, in the "PS" column, that cache memory location 86 is the previous LRU cache memory block from segment S2. Therefore, the cache manager 22 refers to the cache directory row for cache memory location 86 (FIG. 5) and determines that a cache memory block from disk 6, segment S2, track 2, block 2, is in LRU group G5 but is clean. Therefore, this block will not be destaged and the corresponding block in the initial layout table is modified to have a "0" to record the fact that it is clean and should not be destaged.

The cache manager 22 next examines the row in the cache directory of FIGS. 3–6 for cache memory location 86 (FIG. 5) and determines from the column marked "PS" that cache memory location 94 is the previous LRU cache block from segment S2. The cache manager therefore examines the row in the cache directory for cache memory location 94 (FIG. 5) and determines that a cache memory block from disk 6, segment S2, track 2, block 0 is in LRU group G4 but is a clean block. Therefore, this block also should not be destaged and its corresponding block in the initial layout table of FIG. 17 is modified by the cache manager to have a "0" to record this fact, as reflected in FIG. 18. Next, the cache manager examines the cache directory column marked "PS" for cache memory location 94 (FIG. 5) and determines that cache memory location 37 is the previous LRU cache block in segment S2.

When the cache manager 22 examines the row in the cache directory for cache memory location 37 (FIG. 4), it determines that a cache memory block from disk 9, segment S2, track 0, block 2, is in LRU group G4 and is a dirty block. Therefore, this block should be destaged and its corresponding block in the initial layout table of FIG. 17 is marked by the cache manager with a "4" to indicate this fact, as reflected in the final layout table of FIG. 18. The cache manager repeats the process described above by marking the layout table entries for blocks that are in the cache memory with a "0" if they are clean, "2" if they are dirty, but not in LRU groups G4 or G5, and with a "4" or "5" if they are dirty and are in LRU groups G4 or G5, respectively. The cache manager stops the process when cache memory location 8 has been processed, because it is the beginning of the segment S2 list and all items in the list will have been processed.

When the cache manager 22 completes the process, the final layout table illustrated in FIG. 18 results, where the number of blocks in cache memory and the number of blocks that are to be destaged are listed at the bottom of the table in the rows marked "In-Cache" and "Destage", respectively. The minimum number of data and parity write operations to each of the disks are listed at the right side of the table under the columns marked "Must Write" with "D" for data blocks and "P" for parity blocks.

As described above with respect to destaging due to the Ta value, the cache manager 22 can write each parity block to disk after destaging due to the Tc value in either a read-modify-write sequence or a read-parity-group sequence. The cache manager will choose between the two alternatives for each parity group that has modified blocks to be destaged as described above. Also as described above, the cache manager can refuse to read or write, in support of destaging, to any disk that has a read utilization rate of greater than U1%, will carry out destaging only if it does not add more than Z ms of busy time to a disk having between U1% and U2% read utilization, and will allow reads and writes in support of destaging to disks that have a read utilization rate of less than U2%.

Again, for purposes of illustration, if U1×30, U2=20, and Z=20, then the block on disk 4 that should be destaged (FIG. 18), will not be destaged because disk 4 is 37% utilized. Therefore, the final layout table will be revised as illustrated in FIG. 19. Likewise, the two parity blocks on disk 1 that must be destaged will be destaged by the read-parity-group method in the first instance and by the read-modify-write sequence in the second instance. The remaining disks can be either read, written, or both because they are under 20% utilized.

Once again, the cache manager 22 determines the processing to follow by first dealing with disk 4. Because disk 4 is utilized at over U1%, modified blocks in segment S2 are not destaged and are marked with a "2" to indicate that they are in the cache memory and are dirty but are not to be destaged. Next, because disk 1 is utilized at greater than U2%, no additional read operations that exceed Z=20 msec should be added to disk 1, but because two parity blocks must be updated, the best that the cache manager can achieve is to obtain the first parity by the read-parity-group sequence, which introduces no additional read operations to either disk 4 or disk 1 and to obtain the second parity block by the read-modify-write sequence, which introduces no additional read operations to disk 4 and introduces only one additional read operation to disk 1. Those skilled in the art will appreciate that the cache manager has knowledge of the approximate time necessary for read operations through knowledge of the size of a block to be written, disk seek times, head location, and the like. Because none of the parity groups having modified blocks to destage have a data block from disk 1 in the cache memory, all remaining destaging must be done via the read-modify-write sequence.

Alternatively, rather than using the Z value to limit read operations in the event of a utilization rate greater than U2%, the cache manager 22 may instead simply attempt to minimize read operations on the affected disk. For example, the cache manager might permit no read operations to take place from the affected disk in support of generating new parity values.

The sequence of required read operations and write operations is shown in FIG. 20, where "R" is the first block to be read on each disk and, if present, the remaining "r" blocks are read in the same input/output operation or disk revolution. After all read operations are completed, the write operations can begin where "W" is the first block to be written on each disk and, if present, the remaining "w" blocks are written in the same input/output operation or disk revolution.

When a request to read or write a record is received by the cache manager 22, the cache manager must obtain a block containing the record and place it in the cache memory 20 if it is not already there. The cache manager must then read or write the record and update the cache directory 34, along with any control values that change due to the read or write request. The first step to be taken by the cache manager in responding to a request is to determine if the block containing the requested record is in the cache memory. As known to those skilled in the art, this is accomplished by "hashing" the name of the record to an entry in a hash table. If the name is found in the hash table, then a cache memory location is obtained for the block that contains the record. Those skilled in the art will appreciate that the hash table is typically part of the cache memory directory illustrated in FIGS. 3–6.

The LRU list of FIGS. 7–10 and the entries in the Destage Control Values table of FIG. 11 are updated by the cache manager 22 after each read or write request. Those skilled in the art will be aware of various techniques that are applied to update these tables. These techniques, for example, involve logically removing the requested item from the LRU list in FIGS. 7–10, noting what LRU group the requested record came from, decreasing the number of items in that group by one, inserting the requested item at the beginning of the LRU list, increasing the number of items in the group at the top of the list, and adjusting the last items in each group so that the proper number of items are in each group and the first and last members of each group are correct, as listed in FIG. 11. The values for the current arm position listed in FIG. 12 can be updated after each read or write request is issued. The values for Ui(n), the current estimated read request disk utilization of disk i after a request n to the disk ends, can be updated in accordance with the following pseudocode:

Let Si(n) be the starting time of read request-n to disk-i.

Let Ei(n) be the ending time of read request-n to disk-i, where $Ei(0)=Si(1)-(\text{Avg. SeekTime}+\text{Ave. Latency})$.

Let Bi(n) be the busy time of read request-n to disk-i, where $Bi(n)=$ the smaller of $Ei(n)-Si(n)$ or $Ei(n)-Ei(n-1)$, and Let Ii(n) be the idle time of read request-n to disk-i, where $Ii(n)=$ the larger of $Si(n)-Ei(n-1)$ or 0, and Then Ui(n) is the Current Estimated Read-Request Disk-Utilization of disk-i just after request-n to disk-i ends, and is calculated by $$Ui(n) = \frac{p * Bi(n)}{Ii(n) + Bi(n)} + (1-p) * Ui(n-1),$$

where Ui(0)=0.30, and where (0>=p>=1) is a "past factor" p and indicates how much the past busy periods and the past idle periods affect the present estimate of Ui(n), where p=1 means the past has no effect, and p=0 means Ui(n) never changes from Ui(0). A value of p=0.67 is used by the preferred embodiment of this invention.

Figure 21:
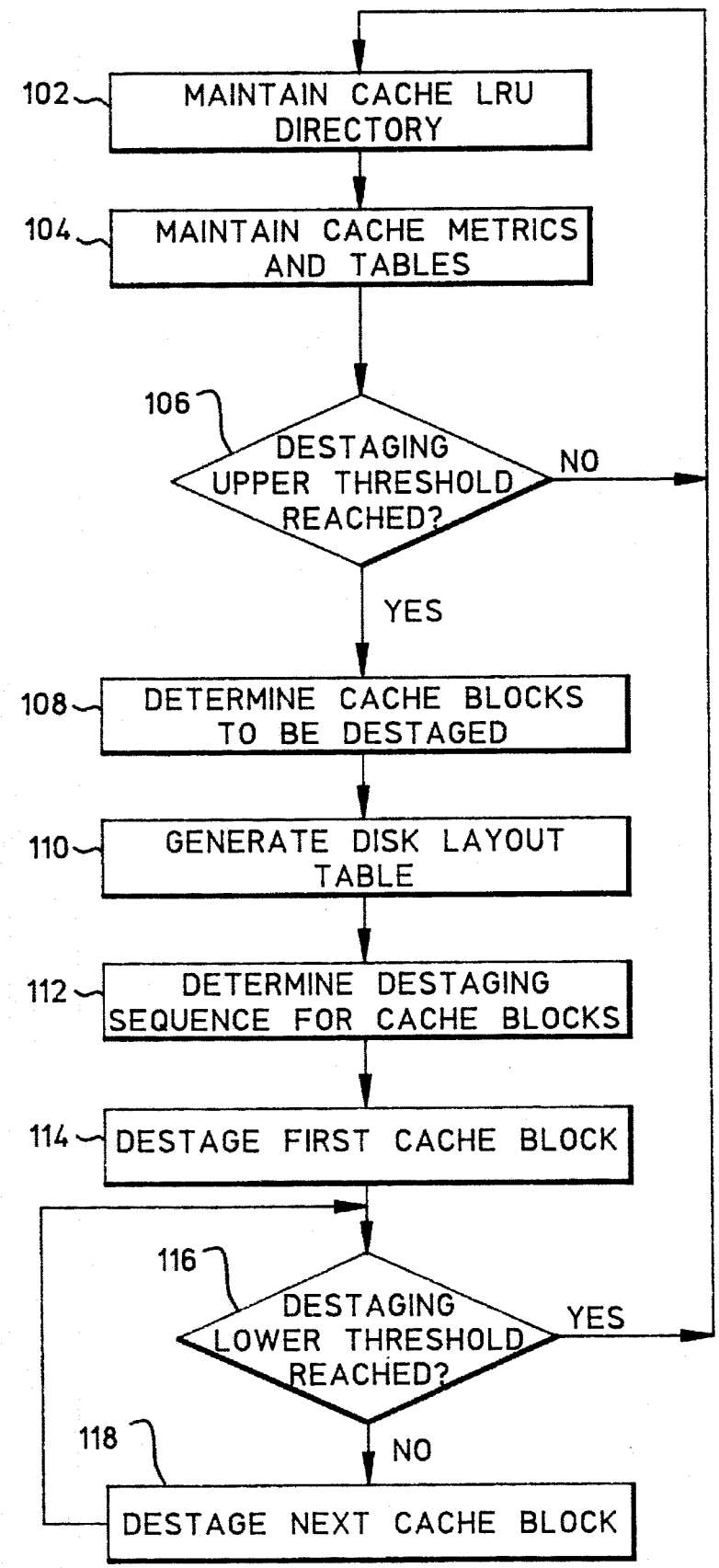
FIG. 21 is a flow diagram illustrating the destaging processing carried out by the controller of FIG. 1.

FIG. 21 is a simplified flow diagram illustrating the processing steps carried out by the storage device array controller 18 illustrated in FIG. 1. The controller begins at the flow diagram box numbered 102 by maintaining the cache LRU directory, including the information concerning segment number and next and previous block and segment statistics. Next, the controller maintains the various cache metrics and tables described above, as indicated by the flow diagram box numbered 104. These tables include, for example, the Destage Control Values table illustrated in FIG. 11 and the associated metrics, such as utilization rates. The controller, at the decision box numbered 106, next determines if the destaging upper threshold value has been reached. In the preferred embodiment, these values correspond to the Ta and Tc values. If neither of these values has been reached, then the controller proceeds with its normal operations, and continues to maintain the directory and tables, as indicated by the arrow pointing to the flow diagram box numbered 102. If either one of the upper threshold values has been reached, then the controller carries out its processing as described above to determine the cache blocks to be destaged, as indicated at the flow diagram box numbered 108.

After the controller determines which cache blocks will be destaged, it generates the disk layout table described above, as indicated by the flow diagram box numbered 110. The controller then determines the destaging sequence for cache blocks indicated by flow diagram box 112, and then destages the first determined cache block, indicated by flow diagram box 114. The controller then checks to determine if the lower threshold value for destaging has been reached at the decision box numbered 116. If the lower threshold has been reached, then a sufficient number of dirty blocks have been destaged and normal operation can resume, as indicated by the flow arrow returning to flow diagram box 102. If the lower threshold value has not been reached, then an insufficient number of dirty blocks have been destaged. Therefore, the controller destages the next cache block, indicated at the flow diagram box numbered 118, and then checks again for the lower threshold value being reached at flow diagram box 116. The processing steps in the flow diagram can be implemented as software programming steps carried out by the controller.

In accordance with the invention, a controller of a storage device redundant array with parity divides the memory locations of the storage devices into segments across the devices and includes a non-volatile cache memory, which the controller divides into least-recently-used (LRU) groups. Either the number of segments or the number of LRU groups, or both, is greater than one. The controller includes a cache manager that monitors the number of dirty blocks according to LRU status and begins destaging when the number of dirty blocks in a predetermined LRU group exceeds an upper threshold value. The cache manager begins destaging with the dirty blocks from the segment having the greatest number of dirty blocks and halts the destaging when the number of dirty blocks in the predetermined LRU group drops below a lower threshold value. The number of segments and LRU groups and the threshold values can be selected to maximize cache hit ratio and minimize storage device utilization. As the cache memory usage changes, the data blocks comprising the predetermined LRU group can change, but the cache manager will continue to monitor the number of dirty blocks and control destaging as described. The controller in accordance with the invention thereby maximizes cache hit ratio and minimizes storage device utilization in response to changing cache memory usage.

The present invention has been described above in terms of a presently preferred embodiment so that an understanding of the present invention can be conveyed. There are, however, many configurations for storage device array controllers not specifically described herein but with which the present invention is applicable. The present invention should therefore not be seen as limited to the particular embodiment described herein, but rather, it should be understood that the present invention has wide applicability with respect to storage device array controllers generally. All modifications, variations, or equivalent arrangements that are within the scope of the attached claims should therefore be considered to be within the scope of the invention.

We claim:

1. A method of controlling the destaging of data blocks from memory locations of a non-volatile cache memory to their respective corresponding storage locations in a storage device array, the storage device array comprising a plurality of storage devices on which data is stored, the method comprising the steps of:

dividing the storage locations of the storage devices into segments that extend across the storage devices, each segment including a plurality of storage location blocks;

identifying cache memory locations containing data that has been modified from the corresponding storage device array storage location value, comprising dirty blocks in the cache memory, and determining the number of dirty blocks corresponding to each storage device segment;

maintaining a cache directory having an ordering of the cache memory locations in order of least recently used (LRU) memory locations;

dividing the cache LRU directory into a predetermined number of LRU groups;

beginning destaging when the number of dirty blocks from a predetermined one of the cache memory LRU groups exceeds a predetermined upper threshold value; and destaging dirty blocks from one or more of the LRU groups in the cache memory to their corresponding storage locations in respective storage devices of the storage array;

halting destaging when the number of dirty blocks from the predetermined one of the cache memory LRU groups drops below a predetermined lower threshold value.

2. A method as defined in claim 1, wherein the step of dividing the storage locations comprises dividing the storage locations into a number of segments that is greater than one.

3. A method as defined in claim 1, wherein the step of dividing the cache LRU directory comprises dividing the cache LRU directory into a number of LRU groups that is greater than one.

4. A method of controlling the destaging of data blocks from memory locations of a non-volatile cache memory to their respective corresponding storage locations in a storage device array, the storage device array comprising a plurality of storage devices on which data is stored, the method comprising the steps of:

dividing the storage locations of the storage devices into segments that extend across the storage devices, each segment including a plurality of storage location blocks;

identifying cache memory locations containing data that has been modified from the corresponding storage device array storage location value, comprising dirty blocks in the cache memory, and determining the number of dirty blocks corresponding to each storage device segment;

maintaining a cache directory having an ordering of the cache memory locations in order of least recently used (LRU) memory locations;

dividing the cache LRU directory into a predetermined number of LRU groups;

beginning destaging when the number of dirty blocks from a predetermined one of the cache memory/LRU groups exceeds a predetermined upper threshold value; and destaging dirty blocks from the cache memory to their corresponding storage locations in respective storage devices of the storage array;

halting destaging when the number of dirty blocks from the predetermined one of the cache memory LRU groups drops below a predetermined lower threshold value;

wherein the step of dividing the storage locations comprises dividing the storage locations into a number of segments that is greater than one;

the step of dividing the cache LRU directory comprises dividing the cache LRU directory into a number of LRU groups that is greater than one; and the predetermined one of the cache memory LRU groups recited in the step of beginning destaging comprises the LRU group having the oldest LRU memory locations.

5. A method of controlling the destaging of data blocks from memory locations of a non-volatile cache memory to their respective corresponding storage locations in a storage device array, the storage device array comprising a plurality of storage devices on which data is stored, the method comprising the steps of:

dividing the storage locations of the storage devices into segments that extend across the storage devices, each segment including a plurality of storage location blocks;

identifying cache memory locations containing data that has been modified from the corresponding storage device array storage location value, comprising dirty blocks in the cache memory, and determining the number of dirty blocks corresponding to each storage device segment;

maintaining a cache directory having an ordering of the cache memory locations in order of least recently used (LRU) memory locations;

dividing the cache LRU directory into a predetermined number of LRU groups;

beginning destaging when the number of dirty blocks from a predetermined one of the cache memory LRU groups exceeds a predetermined upper threshold value; and destaging dirty blocks from the cache memory to their corresponding storage locations in respective storage devices of the storage array;

halting destaging when the number of dirty blocks from the predetermined one of the cache memory LRU groups drops below a predetermined lower threshold value;

wherein the step of dividing the storage locations comprises dividing the storage locations into a number of segments that is greater than one;

the step of dividing the cache LRU directory comprises dividing the cache LRU directory into a number of LRU groups that is greater than one; and the predetermined one of the cache memory LRU groups recited in the step of beginning destaging comprises the LRU group having the next-to-oldest LRU memory locations.

6. A method of controlling the destaging of data blocks from memory locations of a non-volatile cache memory to their respective corresponding storage locations in a storage device array, the storage device array comprising a plurality of storage devices on which data is stored, the method comprising the steps of:

dividing the storage locations of the storage devices into segments that extend across the storage devices, each segment including a plurality of storage location blocks;

identifying cache memory locations containing data that has been modified from the corresponding storage device array storage location value, comprising dirty blocks in the cache memory, and determining the number of dirty blocks corresponding to each storage device segment;

maintaining a cache directory having an ordering of the cache memory locations in order of least recently used (LRU) memory locations;

dividing the cache LRU directory into a predetermined number of LRU groups;

beginning destaging when the number of dirty blocks from a predetermined one of the cache memory LRU groups exceeds a predetermined upper threshold value; and destaging dirty blocks from the cache memory to their corresponding storage locations in respective storage devices of the storage array;

halting destaging when the number of dirty blocks from the predetermined one of the cache memory LRU groups drops below a predetermined lower threshold value;

wherein the step of dividing the storage locations comprises dividing the storage locations into a number of segments that is greater than one;

the step of dividing the cache LRU directory comprises dividing the cache LRU directory into a number of LRU groups that is greater than one; and the predetermined one of the cache memory LRU groups comprises the LRU group with either the oldest or next-to-oldest LRU memory locations.

7. A method of controlling the destaging of data blocks from memory locations of a non-volatile cache memory to their respective corresponding storage locations in a storage device array, the storage device array comprising a plurality of storage devices on which data is stored, the method comprising the steps of:

dividing the storage locations of the storage devices into segments that extend across the storage devices, each segment including a plurality of storage location blocks;

identifying cache memory locations containing data that has been modified from the corresponding storage device array storage location value, comprising dirty blocks in the cache memory, and determining the number of dirty blocks corresponding to each storage device segment;

maintaining a cache directory having an ordering of the cache memory locations in order of least recently used (LRU) memory locations;

dividing the cache LRU directory into a predetermined number of LRU groups;

beginning destaging when the number of dirty blocks from a predetermined one of the cache memory LRU groups exceeds a predetermined upper threshold value; and destaging dirty blocks from the cache memory to their corresponding storage locations in respective storage devices of the storage array;

halting destaging when the number of dirty blocks from the predetermined one of the cache memory LRU groups drops below a predetermined lower threshold value;

wherein the step of dividing the storage locations comprises dividing the storage locations into a number of segments that is greater than one;

the step of dividing the cache LRU directory comprises dividing the cache LRU directory into a number of LRU groups that is greater than one; and the step of beginning destaging comprises the steps of:

defining a first destaging upper threshold value and a second destaging upper threshold value; and beginning destaging when the number of dirty blocks in the LRU group having the oldest LRU memory locations exceeds the first destaging upper threshold value or when the number of dirty blocks in the LRU group having the next-to-oldest LRU memory locations exceeds the second destaging upper threshold value.

8. A method as defined in claim 7, wherein the step of halting destaging comprises the steps of:

defining a first destaging lower threshold value and a second destaging lower threshold value; and halting destaging when the number of dirty blocks in the oldest LRU group drops below the first destaging lower threshold value if the destaging was begun in response to the first destaging upper threshold value, and halting destaging when the number of dirty blocks in the next-to-oldest LRU group drops below the second destaging lower threshold value if the destaging was begun in response to the second destaging upper threshold value.

9. A method as defined in claim 8, wherein the step of dividing the cache LRU directory comprises defining a plurality of LRU groups such that the size of no LRU group is smaller than that of the oldest LRU group.

10. A method as defined in claim 9, wherein the step of defining a first destaging lower threshold value comprises defining a value such that destaging will not be halted until substantially all dirty blocks in the oldest LRU group have been destaged.

11. A method of controlling the destaging of data blocks from memory locations of a non-volatile cache memory to their respective corresponding storage locations in a storage device array, the storage device array comprising a plurality of storage devices on which data is stored, the method comprising the steps of:

dividing the storage locations of the storage devices into segments that extend across the storage devices, each segment including a plurality of storage location blocks;

identifying cache memory locations containing data that has been modified from the corresponding storage device array storage location value, comprising dirty blocks in the cache memory, and determining the number of dirty blocks corresponding to each storage device segment;

maintaining a cache directory having an ordering of the cache memory locations in order of least recently used (LRU) memory locations;

dividing the cache LRU directory into a predetermined number of LRU groups.

beginning destaging when the number of dirty blocks from a predetermined one of the cache memory LRU groups exceeds a predetermined upper threshold value; and destaging dirty blocks from the cache memory to their corresponding storage locations in respective storage devices of the storage array;

halting destaging when the number of dirty blocks from the predetermined one of the cache memory LRU groups drops below a predetermined lower threshold value;

wherein the step of dividing the cache LRU directory comprises dividing the cache LRU directory into a number of LRU groups that is greater than one; and the step of destaging dirty blocks comprises the steps of:

identifying a storage device array segment having the greatest number of dirty blocks in the predetermined LRU group; and destaging all dirty blocks in the identified storage device array segment that belong to the predetermined LRU group.

12. A method of controlling the destaging of data blocks from memory locations of a non-volatile cache memory to their respective corresponding storage locations in a storage device array, the storage device array comprising a plurality of storage devices on which data is stored, the method comprising the steps of:

dividing the storage locations of the storage devices into segments that extend across the storage devices, each segment including a plurality of storage location blocks;

identifying cache memory locations containing data that has been modified from the corresponding storage device array storage location value, comprising dirty blocks in the cache memory, and determining the number of dirty blocks corresponding to each storage device segment;

maintaining a cache directory having an ordering of the cache memory locations in order of least recently used (LRU) memory locations;

dividing the cache LRU directory into a predetermined number of LRU groups;

beginning destaging when the number of dirty blocks from a predetermined one of the cache memory LRU groups exceeds a predetermined upper threshold value; and destaging dirty blocks from the cache memory to their corresponding storage locations in respective storage devices of the storage array;

halting destaging when the number of dirty blocks from the predetermined one of the cache memory LRU groups drops below a predetermined lower threshold value;

wherein the step of dividing the storage locations comprises dividing the storage locations into a number of segments that is greater than one;

the step of dividing the cache LRU directory comprises dividing the cache LRU directory into a number of LRU groups that is greater than one; and the step of dividing the cache directory further comprises:

maintaining a plurality of destaging control values that identify the number of dirty blocks in the LRU group having the oldest LRU memory locations and in the LRU group having the next-to-oldest LRU memory locations.

13. A method as defined in claim 12, wherein the step of destaging dirty blocks comprises the steps of:
identifying a storage device array segment having the greatest number of dirty blocks in the predetermined LRU group; and
destaging all dirty blocks in the identified storage device array segment that belong to the predetermined LRU group.

14. A method as defined in claim 13, wherein the step of destaging dirty blocks further includes the steps of:
determining a read utilization parameter for each of the storage devices; and
permitting destaging to proceed only for those storage devices having a read utilization parameter greater than a first predetermined value.

15. A method as defined in claim 14, wherein the step of permitting destaging to proceed further includes the steps of:
defining a segment layout table that indicates the location of parity and spare blocks within the identified segment and indicates segment storage locations having no corresponding copy in the cache memory;
identifying blocks in the segment layout table that should be destaged; and
destaging only those blocks in the segment layout table identified for destaging that correspond to a storage location in a storage device having a read utilization parameter greater than the first predetermined value.

16. A method as defined in claim 15, wherein the step of destaging only blocks from storage devices having a read utilization parameter less than a first value further comprises the step of destaging those blocks only if the busy time generated by the destaging is below a predetermined busy time limit value.

17. A method as defined in claim 16, wherein the step of destaging further comprises permitting unrestricted destaging to a disk if the disk has a read utilization parameter less than a second predetermined value.

18. A method as defined in claim 15, wherein the step of destaging only blocks from storage devices having a read utilization parameter greater than a first value further comprises the step of destaging those blocks and comprises permitting no read operation to take place from any such storage devices in support of generating new parity values.

19. In a computing system having a plurality of storage devices arranged in an array and connected to a central processing unit through an array controller, the array controller having a cache memory for temporarily storing copies of data blocks stored in storage locations of the storage device array, the data blocks stored in the memory locations of the cache memory being modified by applications running in the central processing unit such that the cache data blocks become dirty, having a value different from the value in the corresponding locations of the storage device array, a method of controlling destaging data blocks from the cache memory back to corresponding locations in the storage device array, the method comprising the steps of:
defining a plurality of array memory location segments that extend across individual storage devices of the array;
ordering the cache memory locations in order of least recently used (LRU) memory locations and dividing the LRU-ordered cache memory locations into a predetermined number of LRU groups;
maintaining a plurality of cache memory metrics that identify the number of dirty blocks and identify the least recently used memory locations according to cache memory LRU group;
beginning destaging of dirty blocks from one or more of the LRU groups when the percentage of dirty blocks from a predetermined one of the cache memory LRU groups is equal to a first predetermined value; and
halting destaging when the percentage of dirty blocks from the predetermined one of the cache memory LRU groups is equal to a second predetermined value.

20. In a computing system having a plurality of storage devices arranged in an array and connected to a central processing unit through an array controller, the array controller having a cache memory for temporarily storing copies of data blocks stored in storage locations of the storage device array, the data blocks stored in the memory locations of the cache memory being modified by applications running in the central processing unit such that the cache data blocks become dirty, having a value different from the value in the corresponding locations of the storage, device array, a method of controlling destaging data blocks from the cache memory back to corresponding locations in the storage device array, the method comprising the steps of:
defining a plurality of array memory location segments that extend across individual storage devices of the array;
ordering the cache memory locations in order of least recently used (LRU) memory locations and dividing the LRU-ordered cache memory locations into a predetermined number of LRU groups;
maintaining a plurality of cache memory metrics that identify the number of dirty blocks and identify the least recently used memory locations according to cache memory LRU group;
beginning destaging when the percentage of dirty blocks from a predetermined one of the cache memory LRU groups is equal to a first predetermined value; and
halting destaging when the percentage of dirty blocks from the predetermined one of the cache memory LRU groups is equal to a second predetermined value; wherein:
the predetermined cache memory group for beginning and halting destaging comprises the LRU group having the oldest LRU memory locations.

21. In a computing system having a plurality of storage devices arranged in an array and connected to a central processing unit through an array controller, the array controller having a cache memory for temporarily storing copies of data blocks stored in storage locations of the storage device array, the data blocks stored in the memory locations of the cache memory being modified by applications running in the central processing unit such that the cache data blocks become dirty, having a value different from the value in the corresponding locations of the storage device array, a method of controlling destaging data blocks from the cache memory back to corresponding locations in the storage device array, the method comprising the steps of:
defining a plurality of array memory location segments that extend across individual storage devices of the array;
ordering the cache memory locations in order of least recently used (LRU) memory locations and dividing the LRU-ordered cache memory locations into a predetermined number of LRU groups;

maintaining a plurality of cache memory metrics that identify the number of dirty blocks and identify the least recently used memory locations according to cache memory LRU group;

beginning destaging when the percentage of dirty blocks from a predetermined one of the cache memory LRU groups is equal to a first predetermined value; and halting destaging when the percentage of dirty blocks from the predetermined one of the cache memory LRU groups is equal to a second predetermined value; wherein:

the predetermined cache memory group for beginning and halting destaging comprises the LRU group having the next-to-oldest LRU memory locations.

22. A computing system having a central processing unit and a storage device array comprising a plurality of storage devices on which data is stored, further having a storage device array controller having a non-volatile cache memory for temporarily storing copies of the data blocks, the array controller controlling the destaging of data blocks from memory locations of the cache memory to their respective corresponding storage locations in the storage device array, the computing system further comprising:

an array controller cache manager that divides the storage device array memory locations into a plurality of segments that extend across individual storage devices, each segment including a plurality of tracks and each track having a plurality of storage location blocks;

block detection means for identifying cache memory locations containing data that has been modified from the corresponding storage device array storage location value, comprising dirty blocks in the cache memory, and determining the number of dirty blocks corresponding to each storage device segment; and a cache directory having an ordering of the cache memory locations in order of least recently used (LRU) memory locations and divided into a predetermined number of LRU groups;

wherein the cache manager means begins destaging of dirty blocks from one or more of the LRU groups when the percentage of dirty blocks from a predetermined one of the cache memory LRU groups is equal to a first predetermined value and halts destaging when the percentage of dirty blocks from the predetermined one of the cache memory LRU groups is equal to a second predetermined value.

23. A computing system as defined in claim 22, further including a Destage Control Values table that includes a destaging upper threshold value that specifies the first predetermined dirty block percentage and the predetermined LRU group used by the cache manager in deciding when to begin destaging and that specifies a destaging lower threshold value that specifies the second predetermined dirty block percentage and predetermined LRU group used by the cache manager in deciding when to halt destaging.

24. A computing system having a central processing unit and a storage device array comprising a plurality of storage devices on which data is stored, further having a storage device array controller having a non-volatile cache memory for temporarily storing copies of the data blocks, the array controller controlling the destaging of data blocks from memory locations of the cache memory to their respective corresponding storage locations in the storage device array, the computing system further comprising:

an array controller cache manager that divides the storage device array memory locations into a plurality of segments that extend across individual storage devices, each segment including a plurality of tracks and each track having a plurality of storage location blocks;

block detection means for identifying cache memory locations containing data that has been modified from the corresponding storage device array storage location value, comprising dirty blocks in the cache memory, and determining the number of dirty blocks corresponding to each storage device segment; and a cache directory having an ordering of the cache memory locations in order of least recently used (LRU) memory locations and divided into a predetermined number of LRU groups;

wherein the cache manager means begins destaging when the percentage of dirty blocks from a predetermined one of the cache memory LRU groups is equal to a first predetermined value and halts destaging when the percentage of dirty blocks from the predetermined one of the cache memory LRU groups is equal to a second predetermined value;

further including a Destage Control Values table that includes a destaging upper threshold value that specifies the first predetermined dirty block percentage and the predetermined LRU group used by the cache manager in deciding when to begin destaging and that specifies a destaging lower threshold value that specifies the second predetermined dirty block percentage and predetermined LRU group used by the cache manager in deciding when to halt destaging; and a Disk Status table that indicates read utilization rate for each storage device of the storage device array.

25. A computing system as defined in claim 24, wherein the cache manager permits destaging to proceed only for those storage devices having a read utilization rate less than a first predetermined utilization value.

26. A computing system as defined in claim 25, wherein the cache manager permits destaging to proceed only from a storage device having a read utilization rate less than the first predetermined value and only if the destaging will not add more than a predetermined amount of busy time to the storage device.

27. A computing system as defined in claim 26, wherein the cache manager permits unrestricted destaging to proceed from a storage device having a read utilization rate less than a second predetermined utilization value.

* * * * *